(12) United States Patent
Nogi et al.

(10) Patent No.: US 8,334,173 B2
(45) Date of Patent: Dec. 18, 2012

(54) METHOD FOR MANUFACTURING SEMICONDUCTOR APPARATUS

(75) Inventors: Takao Nogi, Hyogo-ken (JP); Tomoyuki Kitani, Kanagawa-ken (JP); Akira Tojo, Kanagawa-ken (JP); Kentaro Suga, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/694,534

(22) Filed: Jan. 27, 2010

(65) Prior Publication Data

US 2010/0233856 A1  Sep. 16, 2010

(30) Foreign Application Priority Data

Mar. 11, 2009 (JP) ................................. 2009-058708

(51) Int. Cl.
*H01L 21/00* (2006.01)
(52) U.S. Cl. ........ 438/114; 438/118; 438/124; 438/127; 257/E21.599; 257/E21.238; 257/E21.01
(58) Field of Classification Search .................. 438/114, 438/127; 257/737, E21.599, E21.238, E23.01
See application file for complete search history.

(56) References Cited

U.S. PATENT DOCUMENTS

| 6,774,492 B2 | 8/2004 | Ahn et al. | |
| 2008/0217754 A1* | 9/2008 | Tojo et al. | 257/690 |
| 2008/0296760 A1* | 12/2008 | Nogi et al. | 257/737 |
| 2009/0215230 A1* | 8/2009 | Muto et al. | 438/124 |

FOREIGN PATENT DOCUMENTS

| JP | S61-153350 U | 9/1986 |
| JP | H02-120848 U | 9/1990 |
| JP | 5-347324 | 12/1993 |
| JP | 2000-252235 | 9/2000 |
| JP | 2004-186643 | 7/2004 |
| JP | 2004-273997 | 9/2004 |
| JP | 2007-317761 | 12/2007 |

OTHER PUBLICATIONS

Office Action (with English translation) mailed on Jul. 31, 2012, in counterpart Japanese Patent Appln. No. 2009-058708 (6 pages).

* cited by examiner

*Primary Examiner* — Charles Garber
*Assistant Examiner* — Abdulfattah Mustapha
(74) *Attorney, Agent, or Firm* — Oblon, Spivak, McClelland, Maier & Neustadt, L.L.P.

(57) ABSTRACT

A method for manufacturing a semiconductor apparatus includes: forming a protrusion made of a conductor on each of the electrodes provided on a semiconductor wafer top face side of a plurality of semiconductor devices formed in a semiconductor wafer; making a trench in the top face between the plurality of semiconductor devices; filling an insulator into a gap between the protrusions and into the trench to form a sealing member; grinding a bottom face of the semiconductor wafer opposing the top face until the sealing member being exposed to divide the semiconductor wafer into each of the semiconductor devices; forming a first lead made of a conductor on each of the protrusions, the first lead forming a portion of a first external electrode; forming a conductive material layer directly to form a second lead on the bottom face of the plurality of semiconductor devices, the second lead forming the second external electrode; and cutting the sealing member between the plurality of semiconductor devices to separate the plurality of semiconductor devices from each other.

10 Claims, 16 Drawing Sheets

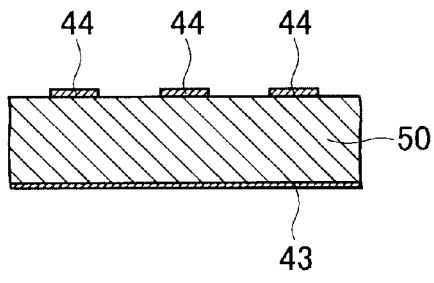
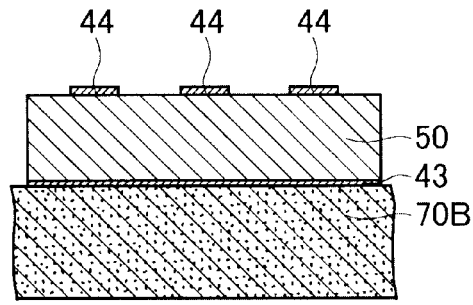
FIG. 10A  FIG. 10B
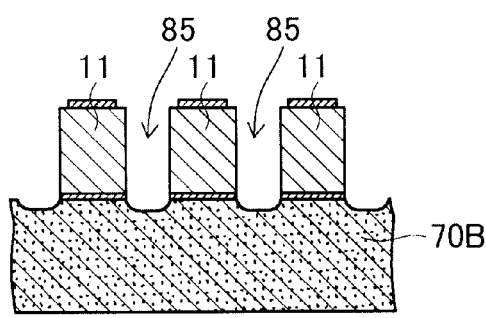
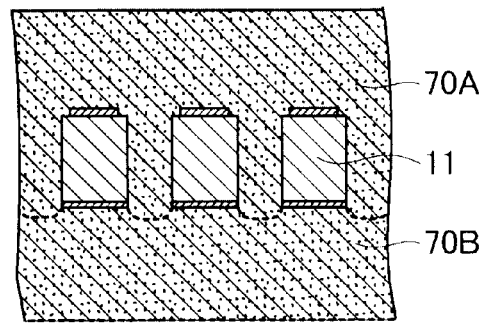
FIG. 10C  FIG. 10D
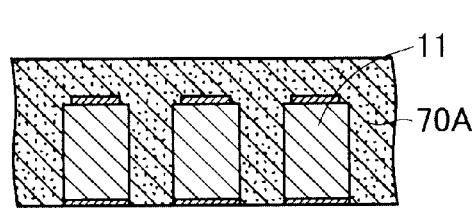
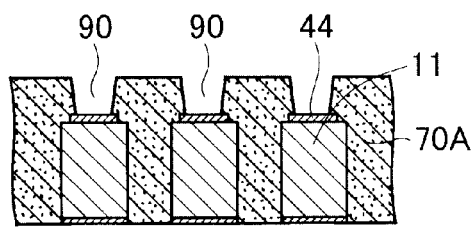
FIG. 10E  FIG. 10F

METHOD FOR MANUFACTURING SEMICONDUCTOR APPARATUS

CROSS-REFERENCE TO RELATED APPLICATIONS

This application is based upon and claims the benefit of priority from the prior Japanese Patent Application No. 2009-58708, filed on Mar. 11, 2009; the entire contents of which are incorporated herein by reference.

BACKGROUND OF THE INVENTION

1. Field of the Invention

The invention relates to a method for manufacturing a semiconductor apparatus.

2. Background Art

There exists a conventional method for manufacturing a semiconductor package including mounting a metal block on a Cu substrate for source wire bonding (for example, refer to JP-A H5-347324 (Kokai) (1993)).

However, the structure of the semiconductor apparatus discussed in JP-A H5-347324 (Kokai) (1993) requires bonding wires and therefore is problematic in that the semiconductor apparatus as an entirety is large, many processing processes are necessary, and costs are high.

Further, another conventional semiconductor apparatus includes a semiconductor device having bumps disposed on a first major surface to draw out wires, a face on a side opposite to the first major surface contacting a first metal electrode via a first conductor, and an outer face covered with an insulator. The wires drawn out from the bumps are connected to a second metal electrode via a second conductor (for example, refer to JP-A 2000-252235 (Kokai)).

However, in the semiconductor apparatus discussed in JP-A 2000-252235 (Kokai), the semiconductor device is not disposed in the central portion of the semiconductor apparatus but is disposed on the first metal electrode side. Thereby, the semiconductor device unfortunately undergoes large shocks during transfer of the semiconductor apparatus. Moreover, the semiconductor apparatus as an entirety is undesirably large and costs unfortunately increase because the conductor is made of a conductive resin, a high melting-point solder, etc., and the metal electrodes are made of Al, Cu, Au, alloys thereof, etc.

SUMMARY OF THE INVENTION

According to an aspect of the invention, there is provided a method for manufacturing a semiconductor apparatus, the apparatus including: a semiconductor device including a first face and a second face opposing each other, and an electrode provided on the first face; a first external electrode opposing the first face of the semiconductor device, the first external electrode including a first major surface substantially parallel to the first face, a first side face substantially perpendicular to the first major surface, and a protrusion protruding in a direction perpendicular to the first major surface to connect to the electrode provided on the first face of the semiconductor device; a second external electrode opposing the second face of the semiconductor device, the second external electrode including a second major surface substantially parallel to the second face, a second side face substantially perpendicular to the second major surface, and an opposite face on a side opposite to the second major surface, the opposite face being substantially the same size as the second major surface; and an insulator covering the semiconductor device and the protrusion of the first external electrode, the first side face and the second side face being mounting faces, the semiconductor device being disposed between the first external electrode and the second external electrode, the method including: forming the protrusion made of a conductor on each of the electrodes of the first face provided on a semiconductor wafer top face side of a plurality of the semiconductor devices formed in a semiconductor wafer; making a trench in the top face between the plurality of semiconductor devices; filling an insulator into a gap between the protrusions and into the trench to form a sealing member; grinding a bottom face of the semiconductor wafer opposing the top face until the sealing member is exposed to divide the semiconductor wafer into each of the semiconductor devices; forming a first lead made of a conductor on each of the protrusions, the first lead forming a portion of the first external electrode; forming a conductive material layer directly to form a second lead on the bottom face of the plurality of semiconductor devices, the second lead forming the second external electrode; and cutting the sealing member between the plurality of semiconductor devices to separate the plurality of semiconductor devices from each other.

According to another aspect of the invention, there is provided a method for manufacturing a semiconductor apparatus, the apparatus including: a semiconductor device including a first face and a second face opposing each other, and an electrode provided on the first face; a first external electrode opposing the first face of the semiconductor device, the first external electrode including a first major surface substantially parallel to the first face, a first side face substantially perpendicular to the first major surface, and a protrusion protruding in a direction perpendicular to the first major surface to connect to the electrode; a second external electrode opposing the second face of the semiconductor device, the second external electrode including a second major surface substantially parallel to the second face, a second side face substantially perpendicular to the second major surface, and an opposite face on a side opposite to the second major surface, the opposite face being substantially the same size as the second major surface; and an insulator covering the semiconductor device and the protrusion of the first external electrode, the first side face and the second side face being mounting faces, the semiconductor device being disposed between the first external electrode and the second external electrode, the method including: forming the protrusion made of a conductor on each of the electrodes of the first face provided on a semiconductor wafer top face side of a plurality of the semiconductor devices formed in a semiconductor wafer; covering the protrusion on the top face side of the semiconductor wafer with an insulator to form a first sealing member; making a trench between the plurality of semiconductor devices from the bottom face side of the semiconductor wafer to reach partway through the first sealing member to separate each of the plurality of semiconductor devices; filling an insulator into the trench to form a second sealing member; grinding the first sealing member to expose the protrusion; forming a first lead made of a conductor on the protrusion, the first lead forming a portion of the first external electrode; forming a conductive material layer directly to form a second lead on the bottom face of each of the plurality of semiconductor devices, the second lead forming the second external electrode; and cutting the first and second sealing members between the plurality of semiconductor devices to separate the plurality of semiconductor devices from each other, the second lead being formed on the bottom face of the plurality of semiconductor devices.

According to still another aspect of the invention, there is provided A method for manufacturing a semiconductor apparatus, the apparatus including: a semiconductor device including a first face and a second face opposing each other, and an electrode provided on the first face; a first external electrode opposing the first face of the semiconductor device, the first external electrode including a first major surface substantially parallel to the first face, a first side face substantially perpendicular to the first major surface, and a protrusion protruding in a direction perpendicular to the first major surface to connect to the electrode; a second external electrode opposing the second face of the semiconductor device, the second external electrode including a second major surface substantially parallel to the second face, a second side face substantially perpendicular to the second major surface, and an opposite face on a side opposite to the second major surface, the opposite face being substantially the same size as the second major surface; and an insulator covering the semiconductor device and the protrusion of the first external electrode, the first side face and the second side face being mounting faces, the semiconductor device being disposed between the first external electrode and the second external electrode, the method including: forming a second sealing member on a bottom face side on a side opposite to a semiconductor wafer top face of a plurality of the semiconductor devices formed on the top face of the semiconductor wafer; making a trench between the plurality of semiconductor devices from the top face of the semiconductor wafer to reach partway through the second sealing member to separate each of the plurality of semiconductor devices; filling an insulator into the trench on the top face side of the semiconductor wafer to cover the electrode with the insulator to form a first sealing member; making an opening in the first sealing member to reach the electrode of the first face on the top face side of each of the plurality of semiconductor devices; forming a conductive material layer directly to form a second lead on the bottom face, the second lead forming the second external electrode; filling a conductive material into the opening of the first sealing member to form the protrusion connected to the electrode; forming a first lead electrically connected to the protrusion, the first lead forming a portion of the first external electrode; and cutting the first sealing member to separate the plurality of semiconductor devices from each other, the plurality of semiconductor devices being connected to the first lead.

BRIEF DESCRIPTION OF THE DRAWINGS

FIGS. 10A to 10F are views of manufacturing processes illustrating the method for manufacturing the semiconductor apparatus according to the third embodiment;

DETAILED DESCRIPTION OF THE INVENTION

Figure 1B:
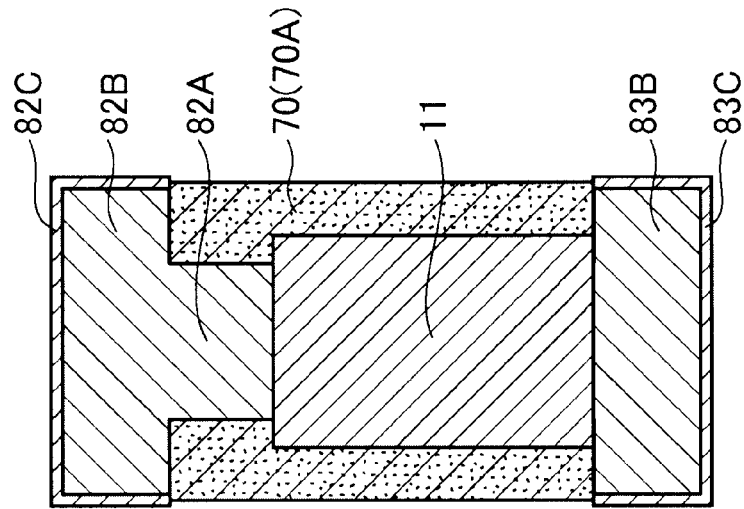
FIGS. 1A and 1B are schematic views of a semiconductor apparatus according to a first embodiment of the invention.

Embodiments of the invention will now be described with reference to the drawings.

The drawings are schematic or conceptual; and the relationships between the thickness and width of portions, the proportional coefficients of sizes among portions, etc., are not necessarily the same as the actual values thereof. Further, the dimensions and proportional coefficients may be illustrated differently among drawings, even for identical portions.

In the specification of the application and the drawings, components similar to those described in regard to a drawing thereinabove are marked with like reference numerals, and a detailed description is omitted as appropriate.

First Embodiment

Figure 1A:
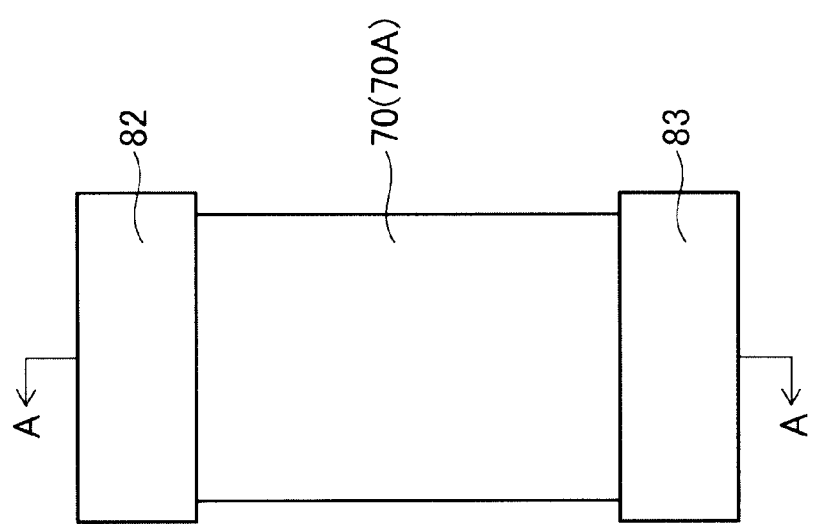

FIGS. 1A and 1B are schematic views of a semiconductor apparatus according to a first embodiment of the invention.

FIG. 1A is a plan view. FIG. 1B is a cross-sectional view along line A-A of FIG. 1A.

As illustrated in FIGS. 1A and 1B, the semiconductor apparatus according to this embodiment includes a semiconductor device 11, a first external electrode 82 and a second external electrode 83 provided on either side thereof, and a sealing member 70 sealing the semiconductor device 11.

The semiconductor device 11 is, for example, a rectangular-parallelepiped diode having a thickness T of, for example, not less than 100 micrometers and not more than 400 micrometers and sides of about 200 micrometers each.

The first external electrode 82 includes a small protrusion 82A connected to the top face of the semiconductor device 11 and a large first lead 82B extending outward.

On the other hand, the second external electrode 83 includes a second lead 83B. The second external electrode 83 (the second lead 83B) is connected to the bottom face of the semiconductor device 11. The width of the cross-section of the second external electrode 83 when cut in a plane perpendicular to a direction from the second external electrode 83 toward the semiconductor device 11 is substantially constant along the direction from the second external electrode 83 toward the semiconductor device 11. In other words, no protrusion is provided on the second external electrode 83.

The semiconductor device 11 and the protrusion 82A are buried in the sealing member 70.

Thus, the semiconductor apparatus according to this embodiment includes the semiconductor device 11, the first external electrode 82, the second external electrode 83, and an insulator (the sealing member 70).

The semiconductor device 11 includes a first face and a second face opposing each other and an electrode (not illustrated) provided on the first face. The semiconductor device 11 is provided in a semiconductor wafer; and the first face may be, for example, the face of the semiconductor wafer on the top face side. The second face may be the face of the semiconductor wafer on the bottom face side opposite to the top face. The semiconductor device 11 may further include an electrode (not illustrated) provided on the second face. In the description hereinbelow, the first face is taken to be the top face, and the second face is taken to be the bottom face.

The first external electrode 82 includes a first major surface opposing the first face (the top face) of the semiconductor device 11 substantially parallel to the first face top face, a first side face substantially perpendicular to the first major surface, and the protrusion 82A protruding in a direction perpendicular to the first major surface to connect to the electrode provided on the first face.

The second external electrode includes a second major surface opposing the second face (the bottom face) of the semiconductor device 11 substantially parallel to the second face (the bottom face), a second side face substantially perpendicular to the second major surface, and an opposite face on the side opposite to the second major surface. The opposite face is substantially the same size as the second major surface. In the case where an electrode is provided on the second face of the semiconductor device 11, the second external electrode is connected to the electrode provided on the second face of the semiconductor device 11.

The sealing member 70 covers the semiconductor device 11 and the protrusion 82A of the first external electrode 82.

In such a semiconductor apparatus, the first side face and the second side face may be used as mounting faces; and the semiconductor device 11 may be disposed between the first external electrode and the second external electrode.

A semiconductor apparatus having such a configuration can be downsized as an entirety and provided with reduced material and manufacturing costs.

Further, in the semiconductor apparatus of this specific example, the protrusion 82A is provided on the first external electrode 82; and no protrusion is provided on the second external electrode 83.

Thereby, comparing to the case where protrusions are provided on both the first external electrode 82 and the second external electrode 83, manufacturing processes can be omitted; components (protrusions) can be omitted; and lower costs are possible.

The sealing member 70 is made of, for example, resin.

The sealing member 70 may include multiple portions (e.g., a first sealing member 70A and a second sealing member 70B). Such multiple portions (e.g., the first and second sealing members 70A and 70B) may be made of the same material or different materials. The multiple portions of the sealing member 70 are bonded without gaps.

The first external electrode 82 and the second external electrode 83 may be formed of, for example, copper. In this specific example, plating layers 82C and 83C such as, for example, nickel and/or tin are formed on surfaces of the first lead 82B and the second lead 83B, respectively.

The plating layer 82C may be considered to be a portion of the first external electrode 82; or the plating layer 82C may be considered to be a separate entity from the first external electrode 82. The plating layer 83C may be considered to be a portion of the second external electrode 83; or the plating layer 83C may be considered to be a separate entity from the second external electrode 83. Hereinbelow, the plating layer 82C is taken to be a separate entity from the first external electrode 82; and the plating layer 83C is taken to be a separate entity from the second external electrode 83. In some cases, either the plating layer 82C or the plating layer 83C may be omitted.

As described below, such a semiconductor apparatus may be mounted onto a substrate and the like.

The total length (the length from the end of the first external electrode 82 to the end of the second external electrode 83 along the direction from the first external electrode 82 toward the second external electrode 83) of the semiconductor apparatus may be, for example, about 600 micrometers. The outer diameter (the outer diameter when the sealing member 70 is cut in a plane perpendicular to the direction from the first external electrode 82 toward the second external electrode 83) of the sealing member 70 may be, for example, a little less than 300 micrometers. The outer diameters (in this specific example, the outer diameters of the plating layers 82C and 83C when cut in planes perpendicular to the direction from the first external electrode 82 toward the second external electrode 83) of the first external electrode 82 and the second external electrode 83 may be, for example, a little more than 300 micrometers. By making the outer diameters of the first external electrode 82 and the second external electrode 83 larger than the outer diameter of the sealing member 70, the external electrodes can easily contact the substrate when mounting the semiconductor apparatus onto the substrate.

The outer diameter of the sealing member 70 may be made larger than the outer diameters of the first external electrode 82 and the second external electrode 83. Thus, it is easy to pick up the semiconductor apparatus with a vacuum collet when mounting the semiconductor apparatus onto the substrate.

Although the plating layers 82C and 83C are recessed from the sealing member 70 in the case where the outer diameter of the sealing member 70 is larger than the outer diameters of the first external electrode 82 and the second external electrode 83, the semiconductor apparatus can be reliably mounted because solder is disposed between the electrode pads of the substrate and the plating layers 82C and 83C when mounting onto the electrode pads of the substrate. The thickness of the solder disposed between the electrode pads and the plating layers 82C and 83C may be, for example, about 120 micrometers.

As recited above, the side face of the sealing member 70 may be recessed from the first side face of the first external electrode 82 and the second side face of the second external electrode 83.

The first major surface and the first side face of the first external electrode 82 may be plating layers (metal plating layers); and the second major surface and the second side face of the second external electrode 83 may be plating layers (metal plating layers).

The first external electrode 82 may include a plating layer formed on at least the first side face. The second external electrode 83 may include a plating layer formed on at least the second side face.

The first external electrode 82 and the second external electrode 83 may be plated metal.

The semiconductor apparatus of this embodiment is extremely compact; and highly dense mounting is possible. Also, as described below, costs can be reduced because many semiconductor apparatuses can be formed from one semiconductor wafer.

An example of a method for manufacturing a semiconductor apparatus having such a configuration will now be described.

The manufacturing method described hereinbelow is a method for manufacturing a semiconductor apparatus. The semiconductor apparatus includes: the semiconductor device 11 including the first face (the top face) and the second face (the bottom face) opposing each other and the electrode provided on the first face; the first external electrode 82 opposing the first face of the semiconductor device 11, where the first external electrode 82 includes the first major surface substantially parallel to the first face, the first side face substantially perpendicular to the first major surface, and the protrusion 82A protruding in a direction perpendicular to the first major surface to connect to the electrode provided on the first face of the semiconductor device 11; the second external electrode 83 opposing the second face of the semiconductor device 11, where the second external electrode 83 includes the second major surface substantially parallel to the second face, the second side face substantially perpendicular to the second major surface, and the opposite face on a side opposite to the second major surface, where the opposite face is substantially the same size as the second major surface; and the insulator (the sealing member 70) covering the semiconductor device 11 and the protrusion 82A of the first external electrode 82. The first side face and the second side face are mounting faces; and the semiconductor device 11 is disposed between the first external electrode 82 and the second external electrode 83.

Figure 2:
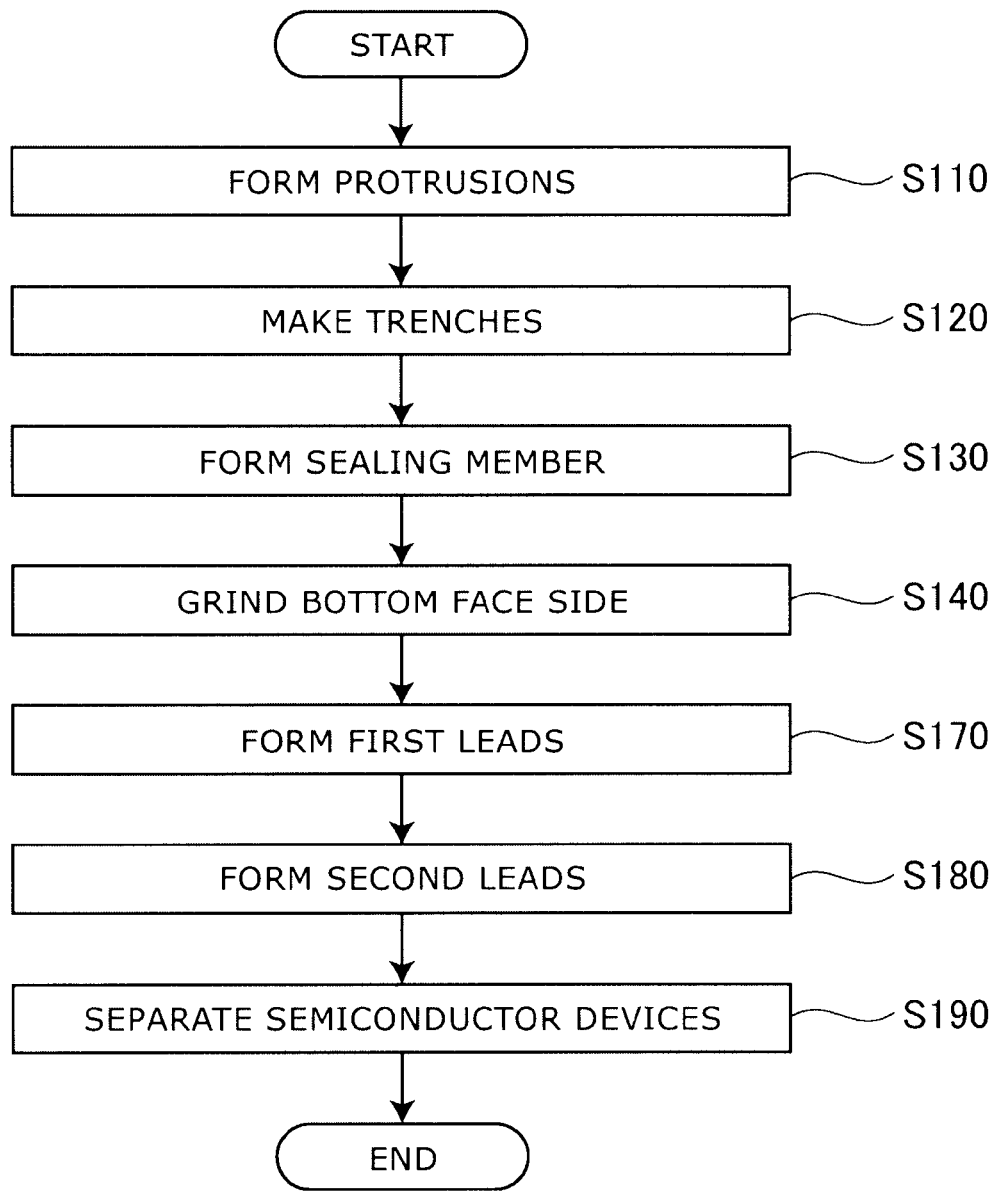
FIG. 2 is a flowchart illustrating a method for manufacturing the semiconductor apparatus according to the first embodiment.

FIG. 2 is a flowchart illustrating the method for manufacturing the semiconductor apparatus according to the first embodiment.

As illustrated in FIG. 2, the method for manufacturing the semiconductor apparatus includes: a process of forming the protrusion 82A made of a conductor on the electrode provided on a semiconductor wafer top face side of multiple semiconductor devices formed in a semiconductor wafer (step S110); a process of making a trench in the top face between the multiple semiconductor devices (step S120); a process of filling an insulator into a gap between the protrusions 82A and into the trench to form the sealing member 70 (step S130); a process of grinding the bottom face of the semiconductor wafer opposing the top face until the sealing member 70 is exposed to divide the semiconductor wafer into each of the semiconductor devices 11 (step S140); a process of forming the first lead 82B made of a conductor on each of the protrusions 82A, where the first lead 82B forms a portion of the first external electrode 82 (step S170); a process of forming the second lead 83B made of a conductor on the bottom face side of the multiple semiconductor devices 11, where the second lead 83B forms the second external electrode 83 (step S180); and a process of cutting the sealing member between the multiple semiconductor devices 11 to separate the multiple semiconductor devices (step S190).

The processes recited above are interchangeable and may be implemented simultaneously within the extent of technical feasibility.

Specifically, the following methods may be used.

Figure 3A:
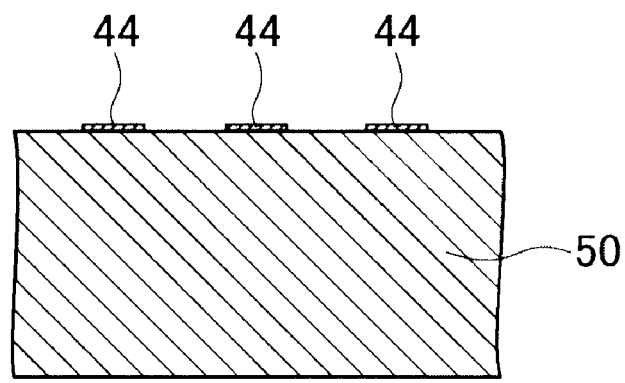
FIGS. 3A and 3B are views of processes illustrating the method for manufacturing the semiconductor apparatus according to the first embodiment.
Figure 3B:
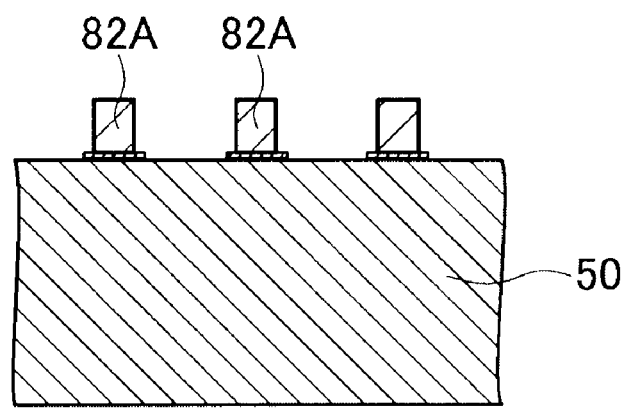

FIGS. 3A and 3B are views of processes illustrating the method for manufacturing the semiconductor apparatus according to the first embodiment.

FIGS. 4A to 4G are views of processes illustrating the method for manufacturing the semiconductor apparatus according to the first embodiment continuing from FIG. 3B.

First, as illustrated in FIG. 3A, a semiconductor wafer 50 is prepared on which electrodes 44 (corresponding to the electrodes provided on the top face, i.e., the first face) are formed. The thickness of the semiconductor wafer 50 is, for example, 600 micrometers.

Then, as illustrated in FIG. 3B, the protrusions 82A are formed on the electrodes 44. Specifically, seed layers of the plating layers are formed on the electrodes 44 by, for example, sputtering a titanium layer and a copper layer. A dry film resist is adhered onto the semiconductor wafer 50; and openings are made in the dry film resist layer above the electrodes 44 by exposing and developing via a mask. Then, copper, etc., is plated to form the protrusions 82A. Subsequently, the dry film resist is peeled, and the seed layers excluding the protrusions 82A are removed by chemical and the like (e.g., etching solution and the like). The thickness of the protrusion 82A may be, for example, about 100 micrometers.

Figure 4A:
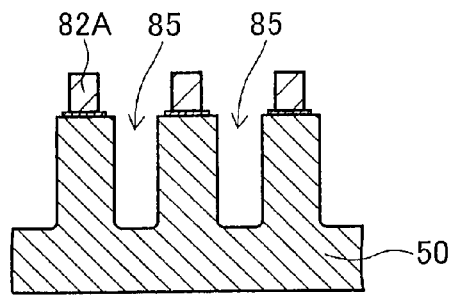
FIGS. 4A to 4G are views of processes illustrating the method for manufacturing the semiconductor apparatus according to the first embodiment continuing from FIG. 3B.

Continuing as illustrated in FIG. 4A, trenches 85 are made in the top face side of the semiconductor wafer 50. For example, trenches having a width of about 150 micrometers may be made lengthwise and crosswise in the top face of the semiconductor wafer 50 by a dicing saw blade.

Figure 4B:
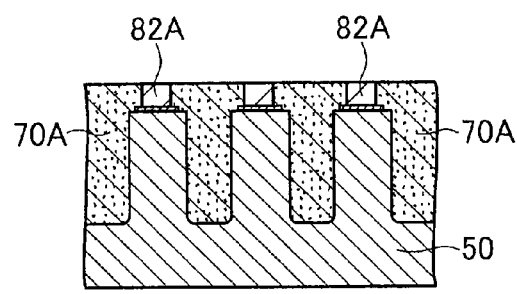

Then, as illustrated in FIG. 4B, a resin is filled into the trenches 85 and into the gaps between the protrusions 82A to form the first sealing member 70A (the sealing member 70) forming the insulator. At this time, the resin may be coated onto the top face of the semiconductor wafer 50 and the top face may be ground to expose the protrusions 82A.

Figure 4C:
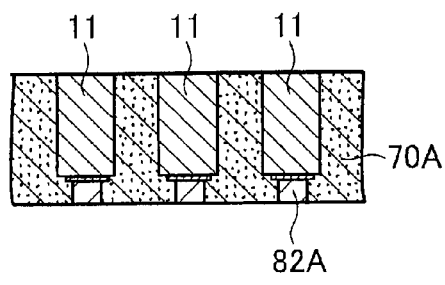

Continuing as illustrated in FIG. 4C, the bottom face side of the semiconductor wafer 50 is ground and thinned until the first sealing member 70A (the sealing member 70) filled into the trenches 85 is exposed. Thereby, the semiconductor devices 11 formed in the semiconductor wafer 50 are separated.

Figure 4D:
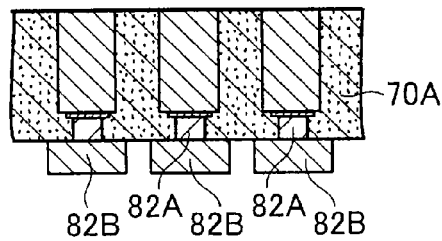

Then, as illustrated in FIG. 4D, the first leads 82B forming portions of the first external electrodes 82 are formed. In other words, the first leads 82B are formed to connect protrusions 82A. For example, in the case where the resin forming the first sealing member 70A (the sealing member 70) is coated onto the top face of the semiconductor wafer 50 and the top face of the resin is subsequently ground to expose the protrusions 82A, the first leads 82B are formed to connect to the protrusions 82A exposed from the resin. The first leads 82B may be formed by, for example, plating copper. Such a process may be similar to the process forming the protrusions 82A. The thickness of the first leads 82B may be, for example, about 100 micrometers.

Figure 4E:
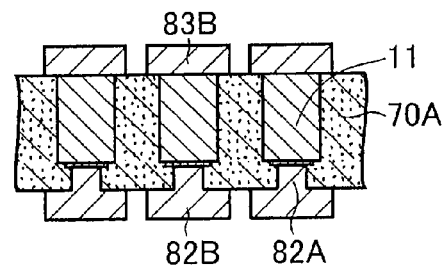

Continuing as illustrated in FIG. 4E, the second leads 83B forming the second external electrodes 83 are formed on the bottom faces (the second faces) of the semiconductor devices 11. The second leads 83B may be formed by, for example, one selected from sputtering, plating copper, and a combination of sputtering and plating copper. Such a process may be similar to the process forming the protrusions 82A. The thickness of the second leads 83B may be, for example, about 100 micrometers.

Figure 4F:
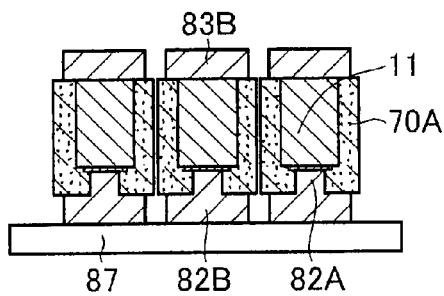

Then, as illustrated in FIG. 4F, the work is adhered to a dicing sheet 87 and separated by a dicing saw blade.

Figure 4G:
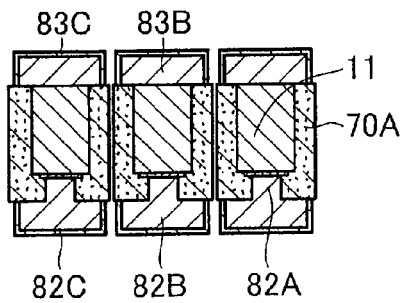

Continuing as illustrated in FIG. 4G, the work is peeled from the dicing sheet 87; and, for example, a nickel layer and a tin layer are plated in this order onto surfaces of the first leads 82B and the second leads 83B to form the plating layers 82C and 83C. In other words, the plating layers 82C and 83C include at least one selected from a nickel layer, a tin layer, and a stacked film having a nickel layer and a tin layer.

In such a case as well, the outer diameter of the sealing member 70 may be smaller or larger than the outer diameters of the plating layers 82C and 83C.

According to such a manufacturing method, a semiconductor apparatus can be downsized as an entirety and provided with reduced material and manufacturing costs.

Although the protrusion 82A is provided on the first external electrode 82 in the semiconductor apparatus and the method for manufacturing the same according to this embodiment, a protrusion is not added to the second external electrode 83. Therefore, comparing to the case where protrusions are provided on both the first external electrode 82 (the top face) and the second external electrode 83 (the bottom face), manufacturing processes can be omitted; components (protrusions) can be omitted; and costs can be reduced even more than in the case where protrusions are provided on both the top face and the bottom face.

In the case where, for example, protrusions are provided on both the first external electrode 82 and the second external electrode 83, a process of forming a second protrusion made of a conductor on the bottom face of the semiconductor wafer to connect to the semiconductor device 11 (e.g., step S150) and a process of filling an insulator into the gap between the second protrusions to form a second sealing member (e.g., step S160) may be implemented, for example, between step S140 and step S170 illustrated in FIG. 2. In comparison, step S150 and step S160 recited above can be omitted in the manufacturing method according to this embodiment; and costs can be reduced even more than in the case where protrusions are provided on both the top face and the bottom face.

Figure 5:
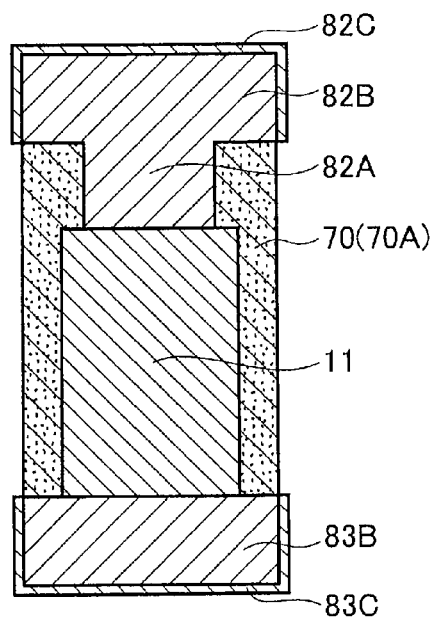
FIG. 5 is a schematic view of another semiconductor apparatus according to the first embodiment.

FIG. 5 is a schematic view of another semiconductor apparatus according to the first embodiment.

Namely, FIG. 5 is a schematic cross-sectional view corresponding to FIG. 1B.

As illustrated in FIG. 5, in the semiconductor apparatus of this specific example as well, a protrusion (the protrusion 82A) is provided on one of the external electrodes (the first external electrode 82). In this specific example, the side face of the insulator (the sealing member 70), the side face of the first external electrode 82, and the side face of the second external electrode 83 are in substantially the same plane.

A semiconductor apparatus having such a configuration may be manufactured by methods such as those recited below.

Figure 6A:
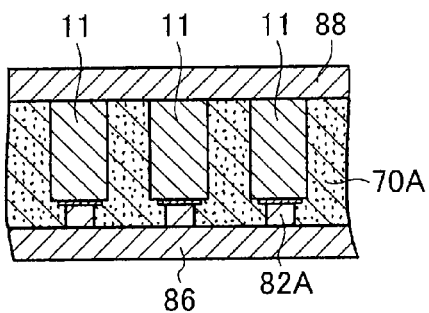
FIGS. 6A to 6C are views of manufacturing processes illustrating a method for manufacturing a variation of the semiconductor apparatus according to the first embodiment.
Figure 6B:
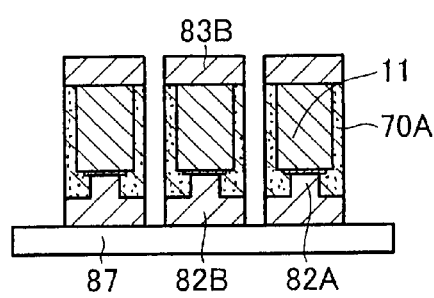
Figure 6C:
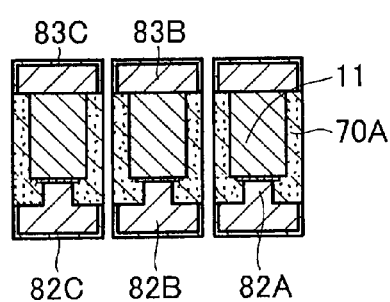

FIGS. 6A to 6C are views of manufacturing processes illustrating a method for manufacturing a variation of the semiconductor apparatus according to the first embodiment.

In this manufacturing method as well, the protrusions 82A forming portions of the first external electrodes 82 are formed on the electrodes 44 of the semiconductor wafer 50; the trenches 85 are made in the top face side of the semiconductor wafer 50; and the first sealing member 70A is formed by filling a resin into the trenches 85 and into the gaps between the protrusions 82A. Such processes are similar to those illustrated in FIG. 3A, FIG. 3B, and FIGS. 4A to 4C and are omitted from the drawings. As illustrated in FIG. 4C, the protrusions 82A and the electrodes (not illustrated) on the bottom faces of the semiconductor devices 11 are exposed from the first sealing member 70A.

As illustrated in FIG. 6A, a conductive sheet 86 (conductive thin film) forming portions of the first external electrodes 82 is adhered onto the exposed faces of the protrusions 82A and the top face of the first sealing member 70A. A conductive sheet 88 forming the second external electrode 83 is adhered onto the electrodes (not illustrated) of the bottom faces of the semiconductor devices 11 and the bottom face of the first sealing member 70A.

Any material and thickness may be used for the conductive sheets 86 and 88. For example, a thin film of Cu and the like having a thickness of 100 micrometers may be used. A conductive bonding layer may be used when adhering the conductive sheets 86 and 88 to the protrusion 82A, the first sealing member 70A, and the electrodes of the bottom face of the semiconductor devices 11.

As illustrated in FIG. 6B, the work (the semiconductor devices 11 to which the conductive sheets 86 and 88 are adhered) are adhered onto the dicing sheet 87 and separated by a dicing saw blade. At this time, the conductive sheet 86 and the conductive sheet 88 are collectively cut with the first sealing member 70A. The width of the dicing trench may be, for example, about 60 micrometers. Thereby, the conductive sheet 86 and the conductive sheet 88 are divided to form the first leads 82B and the second leads 83B, respectively. Thus, the multiple semiconductor devices 11, to which the conductive sheet forming the first lead and the conductive sheet forming the second lead are adhered, is adhered to an adhering base member (the dicing sheet 87) prior to the cutting of the sealing member 70 (and the conductive sheet 86 and the conductive sheet 88). Thereby, the relative positions of the multiple semiconductor devices 11 are fixed by the dicing sheet 87; and the semiconductor devices 11 are not scattered even after the multiple semiconductor devices 11 are separated.

Then, as illustrated in FIG. 6C, the work is peeled from the dicing sheet 87; and, for example, a nickel layer and a tin layer are plated in this order onto surfaces of the first leads 82B and the second leads 83B to form the plating layers 82C and 83C.

Thereby, the semiconductor apparatus illustrated in FIG. 5 can be manufactured. In this manufacturing method, the first leads 82B and the second leads 83B are made not by plating but by adhering a conductive sheet. Therefore, the processes can be simplified, and further cost reductions are possible.

In this manufacturing method, the process of forming the first lead (step S170) in the flowchart illustrated in FIG. 2 is a process of adhering the conductive sheet 86 onto the protrusions 82A. At this time, the conductive sheet 86 also is adhered onto the top face of the first sealing member 70A.

The process of forming the second leads 83B (step S180) is a process of adhering the conductive sheet 88 (a conductive material layer forming the second lead 83B) onto the bottom faces of the semiconductor devices 11 (e.g., the electrodes of the bottom faces of the semiconductor devices 11 and the bottom face of the first sealing member 70A).

Thus, the manufacturing method according to this embodiment may include at least one selected from the process of forming the first lead 82B including adhering a conductive sheet forming the first lead 82B onto the first face side of the semiconductor device 11 and the process of forming the second lead 83B including adhering a conductive sheet forming the second lead 83B onto the second face side of the semiconductor device 11.

Second Embodiment

The manufacturing method according to this embodiment also may be applied to a configuration in which the protrusion 82A is provided on the first external electrode 82 and no protrusion is added to the second external electrode 83 to omit manufacturing processes and provide high productivity.

Figure 7:
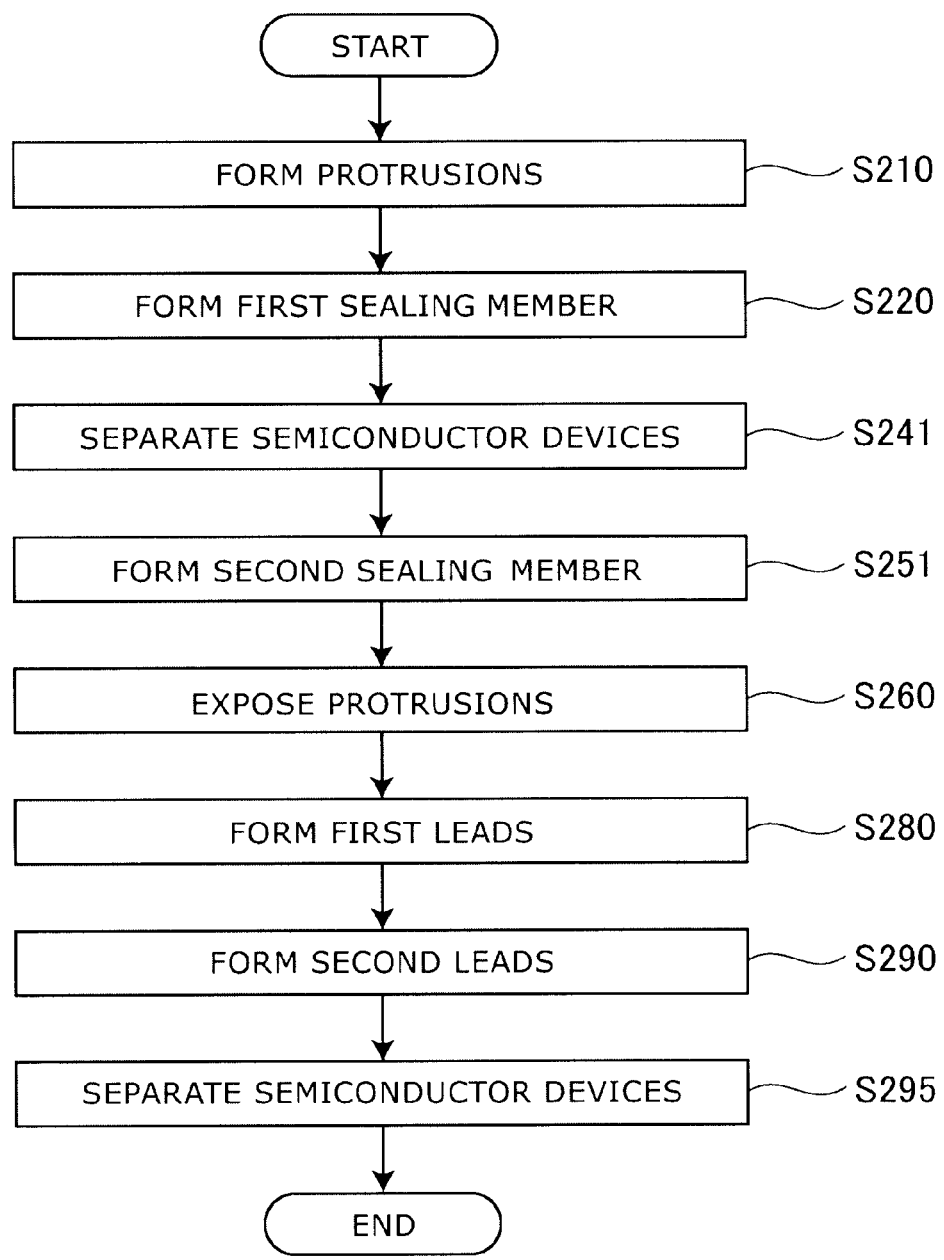
FIG. 7 is a flowchart illustrating a method for manufacturing the semiconductor apparatus according to a second embodiment.

FIG. 7 is a flowchart illustrating the method for manufacturing the semiconductor apparatus according to a second embodiment.

As illustrated in FIG. 7, the manufacturing method according to this embodiment includes: a process of forming the protrusion made of a conductor on each of the electrodes provided on the semiconductor wafer top face side of the multiple semiconductor devices formed in a semiconductor wafer (step S210); a process of covering the protrusion on the top face side of the semiconductor wafer with an insulator to form the first sealing member (step S220); a process of making a trench between the multiple semiconductor devices from the bottom face side of the semiconductor wafer to reach partway through the first sealing member to separate each of the multiple semiconductor devices (step S241); a process of filling an insulator into the trench to form the second sealing member (step S251); a process of grinding the first sealing member to expose the protrusion (step S260); a process of forming a first lead made of a conductor on the protrusion, where the first lead forms a portion of the first external electrode (step S280); a process of forming a conductive material layer directly to form a second lead on the bottom face of the multiple semiconductor devices, where the second lead forms the second external electrode (step S290); and a process of cutting the first and second sealing members between the multiple semiconductor devices to separate the multiple semiconductor apparatuses formed by forming the second lead (step S295).

The processes recited above are interchangeable and may be implemented simultaneously within the extent of technical feasibility.

Specifically, the following methods may be used.

FIGS. 8A to 8H are views of manufacturing processes illustrating the method for manufacturing the semiconductor apparatus according to the second embodiment.

Figure 8A:
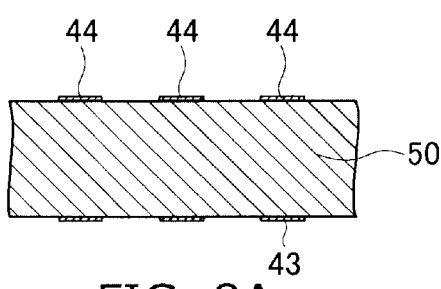
FIGS. 8A to 8H are views of manufacturing processes illustrating the method for manufacturing the semiconductor apparatus according to the second embodiment.

First, as illustrated in FIG. 8A, a semiconductor wafer 50 is prepared on which the semiconductor devices 11, the electrodes 44 (the electrodes provided on the top faces, i.e., the first faces, of the semiconductor devices 11 and included in the semiconductor devices 11), and electrodes 43 (electrodes provided on the bottom faces, i.e., the second faces, of the semiconductor devices 11 and included in the semiconductor devices 11) are formed. Here, the thickness of the semiconductor wafer 50 is, for example, about 300 micrometers.

Figure 8B:
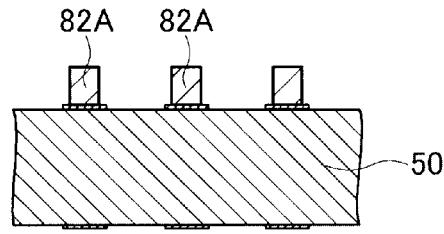

Then, as illustrated in FIG. 8B, the protrusions 82A are formed on the electrodes 44. The method thereof may be similar to that described above in regard to FIG. 3B.

Figure 8C:
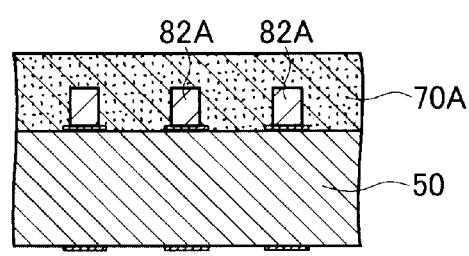

Continuing as illustrated in FIG. 8C, the protrusions 82A are buried in a resin to form the first sealing member 70A. In other words, the protrusions 82A on the top face side of the semiconductor wafer 50 are covered with a resin (insulator) to form the first sealing member 70A. At this time, the resin may be formed thickly to bury the protrusions 82A.

Figure 8D:
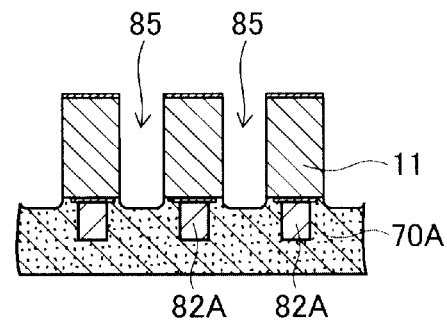

Then, as illustrated in FIG. 8D, a dicing saw blade is used to cut from the bottom face side of the semiconductor wafer 50 to cut the semiconductor wafer 50 to make the trenches 85 reaching partway through the first sealing member 70A. The separating trenches may be provided lengthwise and crosswise in the bottom face of the semiconductor wafer 50.

Figure 8E:
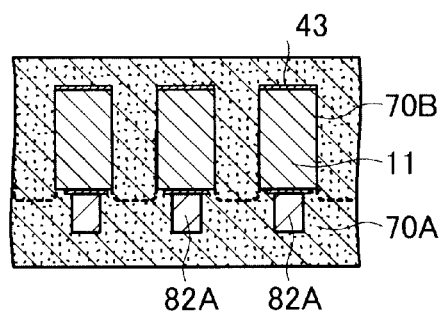

Continuing as illustrated in FIG. 8E, the semiconductor devices 11 are buried in a resin to form the second sealing member 70B. In other words, a resin (insulator) is filled into the trenches 85 to form the second sealing member 70B. Although the electrodes 43 are buried in this specific example, the second sealing member 70B may be formed such that surfaces of the electrodes 43 are exposed from the second sealing member 70B.

Figure 8F:
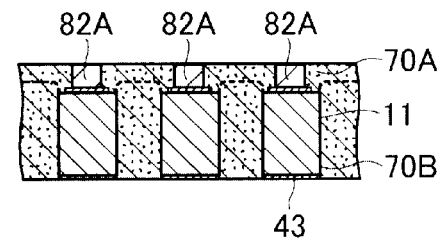

Then, as illustrated in FIG. 8F, the top face of the first sealing member 70A is ground to expose the protrusions 82A. As necessary, the top face of the second sealing member 70B may be ground to expose the electrodes 43.

Figure 8G:
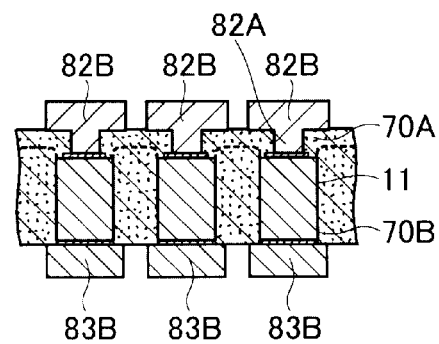

Continuing as illustrated in FIG. 8G, the first leads 82B are formed on the protrusions 82A, and the second leads 83B are formed on the electrodes 43. The first leads 82B and the second leads 83B also may be formed by, for example, plating copper. Such a process may be similar to the process forming the protrusions 82A described in regard to FIG. 3B.

Figure 8H:
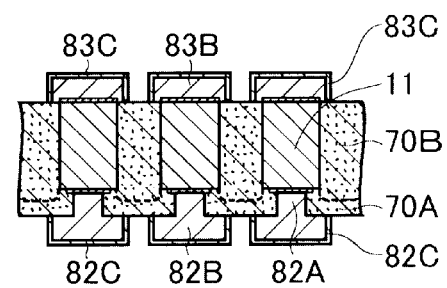

Then, as illustrated in FIG. 8H, a nickel layer and a tin layer, for example, are plated in this order onto surfaces of the first leads 82B and the second leads 83B to form the plating layers 82C and 83C. At least one selected from the plating layers 82C and 83C may include at least one selected from a nickel layer, a tin layer, and a stacked film having a nickel layer and a tin layer. The thicknesses of the plating layers 82C and 83C may be, for example, not less than about 5 micrometers and not more than about 10 micrometers. The semiconductor apparatuses are completed by separating by a dicing saw blade.

Although the protrusion 82A is provided on the first external electrode 82 in the semiconductor apparatus and the method for manufacturing the same according to this embodiment as well, a protrusion is not added to the second external electrode 83. Therefore, comparing to the case where protrusions are provided on both the first external electrode 82 and the second external electrode 83, manufacturing processes can be omitted; components (protrusions) can be omitted; and costs can be reduced even more than in the case where protrusions are provided on both the top face and the bottom face.

In the case where, for example, protrusions are provided on both the first external electrode 82 and the second external electrode 83, a process of forming the second protrusion made of a conductor on the bottom face of the semiconductor wafer to connect to the semiconductor device (e.g., step S230) may be implemented, for example, between step S220 and step S241 illustrated in FIG. 7; and a process of grinding the second sealing member to expose the second protrusion (e.g., step S270) may be implemented between step S251 and step S280 (e.g., between step S260 and step S280). In comparison, step S230 and step S270 recited above can be omitted in the manufacturing method according to this embodiment; and costs can be reduced even more than in the case where protrusions are provided on both the top face and the bottom face.

Thus, according to this embodiment, processes can be omitted; and a semiconductor apparatus can be manufactured by simpler processes.

Third Embodiment

The manufacturing method according to this embodiment also may be applied to a configuration in which the protrusion 82A is provided on the first external electrode 82 and no protrusion is added to the second external electrode 83 to omit manufacturing processes and provide high productivity.

Figure 9:
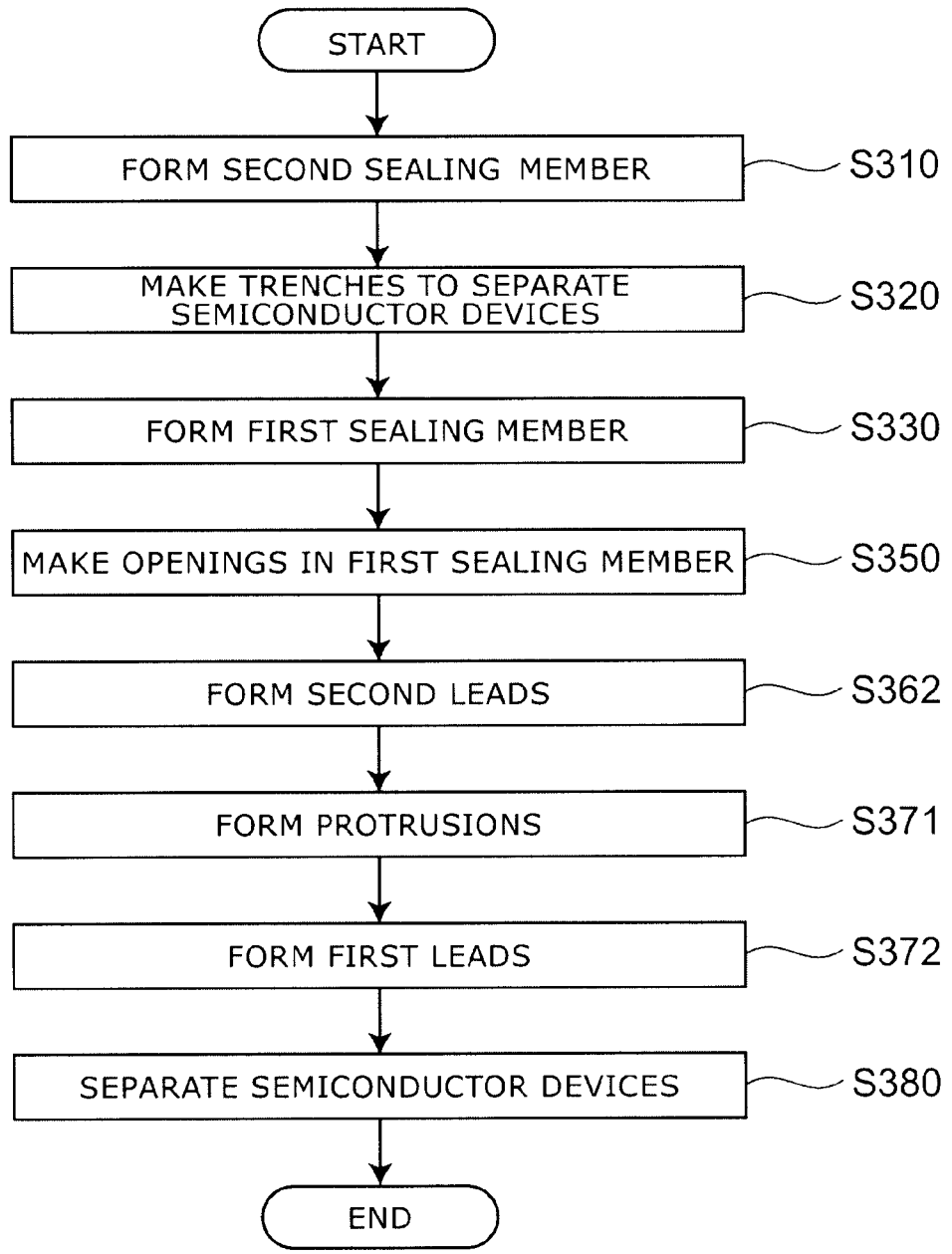
FIG. 9 is a flowchart illustrating another method for manufacturing the semiconductor apparatus according to a third embodiment.

FIG. 9 is a flowchart illustrating another method for manufacturing the semiconductor apparatus according to a third embodiment.

As illustrated in FIG. 9, the manufacturing method according to this embodiment includes: a process of forming the second sealing member on the bottom face (the face on the side opposite to the top face of the semiconductor wafer) side of the multiple semiconductor devices formed on the top face of the semiconductor wafer (step S310); a process of making a trench between the multiple semiconductor devices from the top face side of the semiconductor wafer to reach partway through the second sealing member to separate each of the multiple semiconductor devices (step S320); a process of filling an insulator into the trench on the top face side of the semiconductor wafer to cover the electrode with the insulator to form the first sealing member (step S330); a process of making an opening in the first sealing member to reach the electrode provided on the top face side of each of the multiple semiconductor devices (step S350); a process of forming a conductive material layer on the bottom face directly to form the second lead, where the second lead forms the second external electrode (step S362); a process of filling a conductive material into the opening of the first sealing member to form the protrusion 82A connected to the electrode (step S371); a process of forming the first lead electrically connected to the protrusion, where the first lead forms a portion of the first external electrode (step S372); and a process of cutting at least one selected from the first sealing member and the second sealing member to separate the multiple semiconductor devices formed by the forming of the first lead (step S380).

The processes recited above are interchangeable and may be implemented simultaneously within the extent of technical feasibility.

Specifically, the following methods may be used.

FIGS. 10A to 10F are views of manufacturing processes illustrating the method for manufacturing the semiconductor apparatus according to the third embodiment.

Figure 11A:
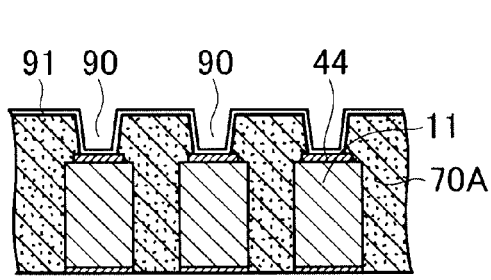
FIGS. 11A to 11E are views of manufacturing processes illustrating the method for manufacturing the semiconductor apparatus according to the third embodiment continuing from FIG. 10F.

FIGS. 11A to 11E are views of manufacturing processes illustrating the method for manufacturing the semiconductor apparatus according to the third embodiment. FIG. 11A continues from FIG. 10F.

First, as illustrated in FIG. 10A, the semiconductor wafer 50 is prepared on which the semiconductor devices 11, the electrodes 44 (the electrodes provided on the top faces, i.e., the first faces, of the semiconductor devices 11) and the electrode 43 (the electrode provided on the bottom faces, i.e., the second faces, of the semiconductor devices 11) are formed. More specifically, this manufacturing method further includes a process of forming the electrode 43 on the second face (the bottom face) of each of the multiple semiconductor devices 11, where the electrode 43 forms a portion of each of the multiple semiconductor devices 11. In this specific example, the electrode 43 is formed as a continuous layer over the multiple semiconductor devices. Here, the thickness of the semiconductor wafer 50 is, for example, about 300 micrometers. In this specific example, the electrode 43 may have a continuous configuration over the multiple semiconductor devices 11 and, for example, may not be patterned.

Then, as illustrated in FIG. 10B, the second sealing member 70B made of a resin layer is formed on the bottom face side of the semiconductor wafer 50. The forming may include molding using a liquid resin, transfer molding, compression molding, a method using a sheet-shaped resin, and the like.

Continuing as illustrated in FIG. 10C, the semiconductor wafer 50 is cut between the semiconductor devices 11 to make the trenches 85 to reach partway through the second sealing member 70B. In other words, the trenches 85 are made between the multiple semiconductor devices from the top face of the semiconductor wafer 50 to reach partway through the second sealing member 70B to separate each of the multiple semiconductor devices 11. Although the semiconductor devices 11 are separated thereby, the semiconductor devices 11 are fixed by the second sealing member 70B.

Then, as illustrated in FIG. 10D, a resin is filled around the trenches 85 and the semiconductor devices 11 to form the first sealing member 70A. In other words, a resin (insulator) is filled into the trenches 85 on the top face side of the semiconductor wafer 50 to form the first sealing member 70A. At this time as well, molding using a liquid resin, transfer molding, compression molding, a method using a sheet-shaped resin, and the like may be used.

Continuing as illustrated in FIG. 10E, the surfaces of each of the first sealing member 70A and the second sealing member 70B are ground and thinned. At this time, the electrodes 44 are in a state of being buried in the first sealing member 70A. On the other hand, the second sealing member 70B is removed. As a result, the electrodes 43 are exposed from the first sealing member 70A.

Then, as illustrated in FIG. 10F, holes 90 are made to reach the electrodes 44 by making holes from the top face of the first sealing member 70A by a laser and the like. In other words, the holes 90 (openings) are made in the first sealing member 70A to reach the electrodes 44 (the electrodes provided on the top face side of each of the multiple semiconductor devices 11).

Continuing as illustrated in FIG. 11A, cleaning is performed on the top faces of the electrodes 44; and a seed layer 91 of copper and the like is formed by electroless plating. The forming of the seed layer 91 is possible using any method such as, for example, sputtering.

Figure 11B:
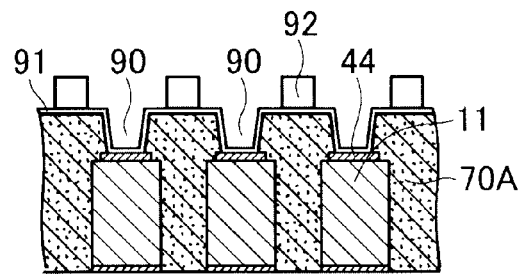

Then, as illustrated in FIG. 11B, a resist 92 is formed on a surface of the first sealing member 70A around the holes 90. The resist 92 has a patterned configuration that does not cover the holes 90 and leaves the holes 90 exposed.

Figure 11C:
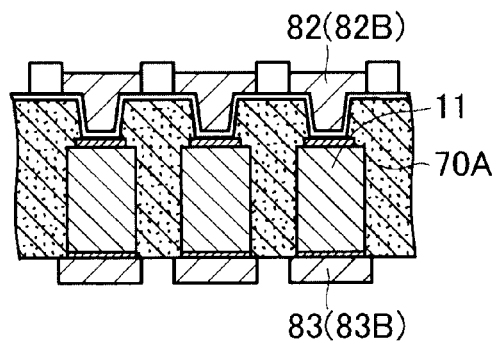

Continuing as illustrated in FIG. 11C, the first external electrodes 82 and the second external electrodes 83 are formed by electroplating copper and the like. In other words, the protrusions 82A (portions where conductive materials are filled in the holes 90) included in the first external electrodes 82, the first leads 82B, and the second leads 83B forming the second external electrodes 83 are formed.

At this time, the first leads 82B and the second leads 83B may be formed simultaneously. However, this embodiment is not limited thereto. The second leads 83B may be formed after the first leads 82B are formed, or the first leads 82B may be formed after the second leads 83B are formed. In the case where the first leads 82B and the second leads 83B are formed separately, for example, a method of coating conductive materials and a method of adhering conductive sheet resin may be applied.

Thus, in this specific example, the process of forming the protrusions 82A may include a process of forming the seed layer 91 on the electrodes 44 (the electrodes provided on the first faces) exposed by the openings (the holes 90) and a process of forming a resist on a surface of the first sealing member 70A around the openings and filling a conductive material into an interior of the openings (the holes 90) on the seed layer 91 by electroplating in a region excluding the resist.

The process of forming the first lead 82B may include forming a resist on a surface of the first sealing member 70A around the openings (the holes 90) and forming a conductive material layer in contact with the protrusions 82A by electroplating in a region excluding the resist.

In this specific example, each of the multiple semiconductor devices 11 further includes an electrode (the electrode 43)

provided on the second face (the bottom face) of each of the multiple semiconductor devices 11 to align among the multiple semiconductor devices 11.

The manufacturing method of this specific example may further include forming the electrode (the electrode 43) on the second face of each of the multiple semiconductor devices 11 to align among the multiple semiconductor devices 11. The process of forming the second lead 83B may include forming the second lead 83B in contact with the electrode 43 (the electrode provided on the second face of each of the multiple semiconductor devices 11).

The process of forming the electrode (the electrode 43) on the second face of each of the multiple semiconductor devices 11 to align among the multiple semiconductor devices 11 may be implemented as illustrated in FIG. 10A prior to, for example, step S310. The process of forming the electrode (the electrode 43) on the second face of each of the multiple semiconductor devices 11 to align among the multiple semiconductor devices 11 may be implemented in any process prior to, for example, the forming of the second lead 83B (step S362) and, for example, may be implemented after the second sealing member 70B is removed to expose the second faces of the semiconductor devices 11 (the faces where the electrodes 43 are provided) from the first sealing member 70A.

Figure 11D:
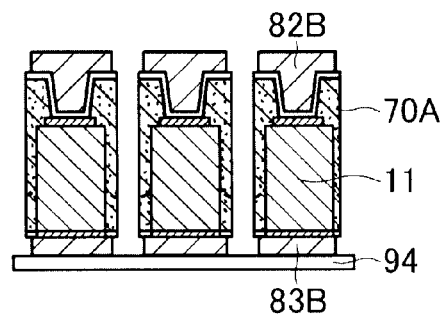

Then, as illustrated in FIG. 11D, the resist 92 is peeled off; the work is adhered to a dicing sheet 94; and the semiconductor apparatuses are separated by cutting with a dicing saw blade.

Figure 11E:
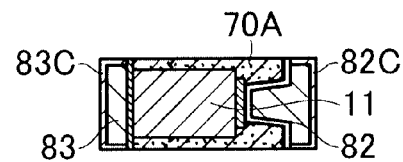

Subsequently, as illustrated in FIG. 11E, the semiconductor apparatuses are peeled from the dicing sheet 94; and the plating layers 82C and 83C are formed on surfaces of the first external electrode 82 and the second external electrode 83.

In such a case as well, the outer diameter of the sealing member 70 may be larger or smaller than the outer diameters of the plating layers 82C and 83C. Thus, the process of filling the conductive material into the openings of the first sealing member to form the protrusions 82A connected to the electrodes (step S371) and the process of forming the first leads 82B forming portions of the first external electrodes 82 electrically connected to the protrusions 82A (step S372) may be collectively implemented by via filling of electroplating.

In the via filling recited above, the electroplating condition is predetermined so that the plating layer is grown first, for example, in a portion where the degree of the convection of plating solution in the interior of the hole 90 is low.

FIGS. 12A to 12F are views of manufacturing processes illustrating another method for manufacturing the semiconductor apparatus according to the third embodiment.

In such a method, the semiconductor wafer 50 illustrated in FIG. 3 is prepared. In other word, a semiconductor wafer 50 is prepared on which electrodes 44 (corresponding to the electrodes provided on the top face, i.e., the first face) are formed.

Figure 12A:
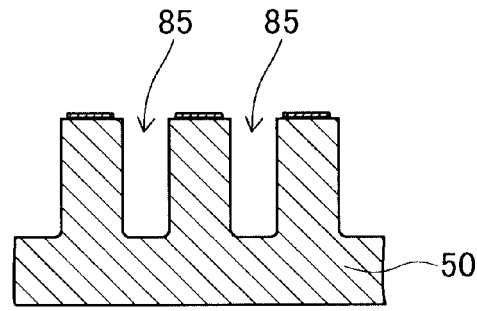
FIGS. 12A to 12F are views of manufacturing processes illustrating another method for manufacturing the semiconductor apparatus according to the third embodiment.

As illustrated in FIG. 12A, similar to FIG. 4A, trenches 85 are made in the top face side of the semiconductor wafer 50. For example, trenches having a width of about 150 micrometers may be made lengthwise and crosswise in the top face of the semiconductor wafer 50 by a dicing saw blade.

Figure 12B:
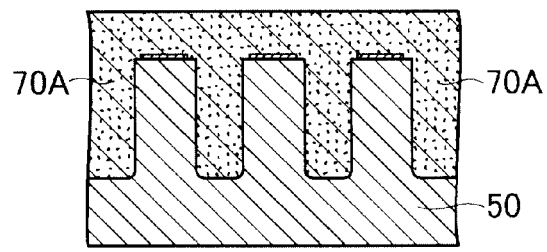

Then, as illustrated in FIG. 12B, similar to FIG. 4B, a resin is filled into the trenches 85 to form a first sealing member 70A (the sealing member 70) forming the insulator.

Figure 12C:
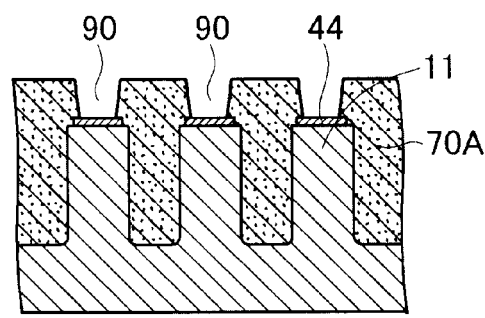

Continuing as illustrated in FIG. 12C, similar to FIG. 10F, holes 90 are made to reach the electrodes 44 by making holes from the top face of the first sealing member 70A illustratively using a laser and the like. In other words, the holes 90 (openings) are made in the first sealing member 70A to reach the electrodes 44 (the electrodes provided on the top face side of each of the multiple semiconductor devices 11).

Figure 12D:
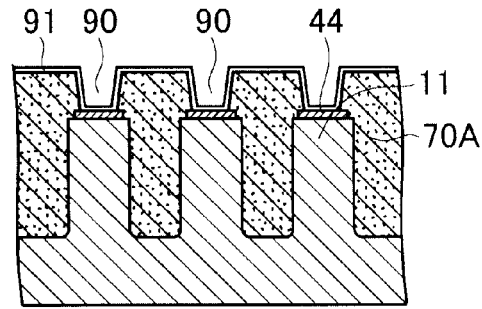

Then, as illustrated in FIG. 12D, similar to FIG. 11A, cleaning is performed on the top faces of the electrodes 44; and a seed layer 91 of copper and the like is formed by electroless plating. The forming of the seed layer 91 is possible using any method such as, for example, sputtering.

Figure 12E:
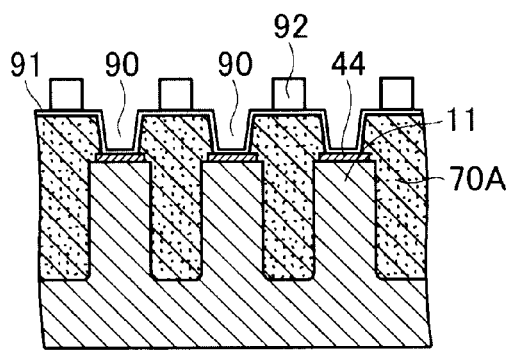

Continuing as illustrated in FIG. 12E, similar to FIG. 11B, a resist 92 is formed on a surface of the first sealing member 70A around the holes 90. The resist 92 has a patterned configuration that does not cover the holes 90 and leaves the holes 90 exposed.

Figure 12F:
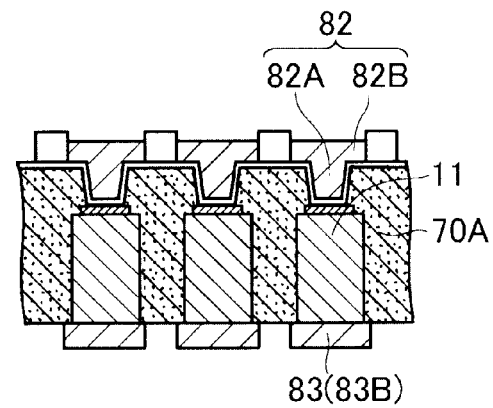

Then, as illustrated in FIG. 12F, similar to FIG. 4C, the bottom face side of the semiconductor wafer 50 is ground and thinned until the first sealing member 70A (the sealing member 70) filled into the trenches 85 is exposed. Thereby, the semiconductor devices 11 formed in the semiconductor wafer 50 are separated. The process of separating the semiconductor devices 11 by grinding the bottom face side of the semiconductor wafer 50 may be implemented in any stage after the process illustrated in FIG. 12B and prior to the process illustrated in FIG. 12F.

Further, similar to FIG. 11C, protrusions 82A and first leads 82B are formed by, for example, electroplating copper and the like. That is, first external electrodes 82 are formed.

Then, second leads 83B are formed. The first leads 82B and the second leads 83B may be formed simultaneously by, for example, electroplating copper and the like. At this time, an electrode 43 is formed on the bottom face of the semiconductor wafer 50 as necessary, and the second lead 83B is formed on the surface of the electrode 43 by electroplating copper and the like.

The second lead 83B may be provided on the entire surface of the bottom face side of the semiconductor wafer 50. In such a case, for example, a method of coating conductive materials and a method of adhering conductive sheet resin may be applied for forming the second lead 83B.

Thus, the first leads 82B and the second leads 83B may be formed simultaneously; the second leads 83B may be formed after the first leads 82B are formed; or the first leads 82B may be formed after the second leads 83B are formed. In the case where the first leads 82B and the second leads 83B are formed separately, for example, a method of coating conductive materials and a method of adhering conductive sheet resin may be applied.

A semiconductor apparatus is manufactured by the methods described in regard to, for example, FIG. 11D and FIG. 11E in which the semiconductor devices 11 are separated and the plating layers 82C and 83C are formed as necessary after the first leads 82B and the second leads 83B are formed in the way recited above.

As described above, the manufacturing method for the semiconductor apparatus according to this embodiment includes: a process of forming the trench 85 between a plurality of semiconductor devices 11 formed on the semiconductor wafer 50 having the plurality of semiconductor devices 11 formed thereon; a process of filling the insulator into the trench 85 to cover the electrode 44 with the insulator to form the sealing member 70 (the first sealing member 70A); a process of making the opening (hole 90) in the sealing member 70 to reach the electrode 44 on the first face of the top face side of each of the multiple semiconductor devices 11; a process of filling the conductive material into the opening of the sealing member 70 to form the protrusion 82A connected to the electrode 44; a process of forming the first lead 82B forming portion of the first external electrode 82 electrically connected to the protrusion 82A; a process of grinding the bottom face of the semiconductor wafer 50 opposing the top face until the sealing member 70 is exposed to divide the semiconductor wafer 50 into each of the semiconductor devices 11; a process of forming the conductive material layer on the bottom face of the semiconductor devices 11 directly to form the second lead 83B, where the second lead 83B forms the second external electrode 83; and a process of cutting the sealing member 70 to separate the multiple semiconductor devices 11 from each other, where the multiple semiconductor devices 11 are connected to the first lead 82B.

At least one of the process of forming the protrusion 82A and the process of forming the first lead 82B may include, for example, the process of forming the resist on the surface of the first sealing member 70A around the opening 90 and filling the conductive material into the interior of the opening on the seed layer by electroplating in a region excluding the resist. A method of adhering the conductive sheet may be applied for at least one of the process of forming the first lead 82B and the process of forming the second lead 83B.

FIGS. 13A to 13D are views of manufacturing processes illustrating another method for manufacturing the semiconductor apparatus according to the third embodiment.

FIGS. 13A to 13D illustrate another example of the processes continuing from FIG. 11A.

Figure 13A:
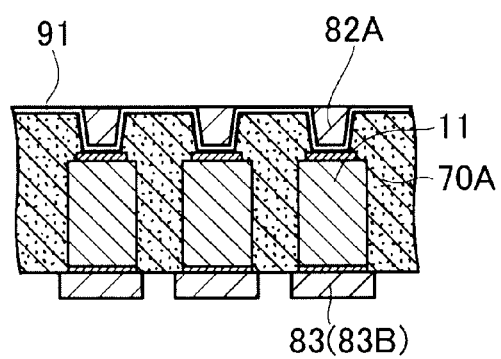
FIGS. 13A to 13D are views of manufacturing processes illustrating another method for manufacturing the semiconductor apparatus according to the third embodiment.

As illustrated in FIG. 13A, the second lead 83B is formed on the second face of each of the multiple semiconductor devices 11 (step S362). Subsequently, the protrusions 82A are formed by electroplating copper and the like (step S371). A method of coating, for example, a conductive paste and the like by various methods such as printing, potting and the like may be used for the forming of the protrusions 82A. The order of step S362 and step S371 may be interchanged.

Figure 13B:
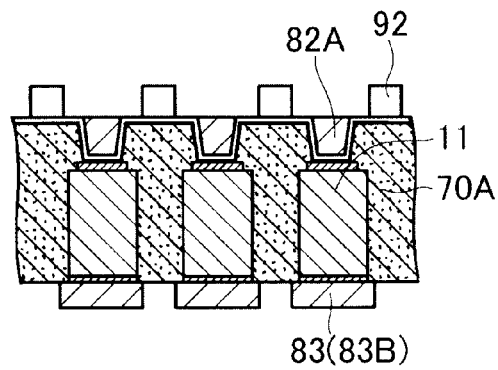

Then, as illustrated in FIG. 13B, a resist 92 is formed on a surface of the first sealing member 70A around the holes 90. The resist 92 has a patterned configuration that does not cover the holes 90 and leaves the holes 90 exposed.

Figure 13C:
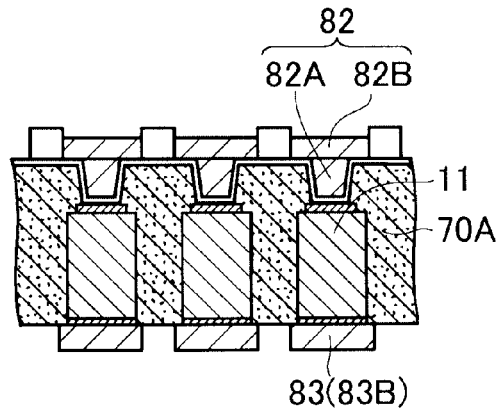

Continuing as illustrated in FIG. 13C, the first leads 82B are formed on the protrusions 82A uncovered by the resist 92 to form the first external electrodes 82 (step S372).

Figure 13D:
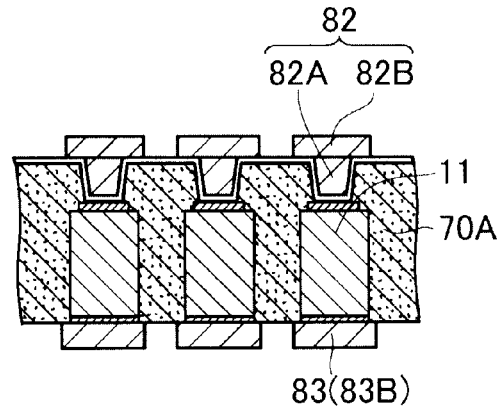

Then, as illustrated in FIG. 13D, the resist 92 is peeled off; and similar to those illustrated in, for example, FIG. 11D, the semiconductor apparatuses are completed by separating the semiconductor devices 11.

For example, after the process described with reference to FIG. 12C, the bottom face side of the semiconductor wafer 50 is ground to divide the wafer into the semiconductor devices 11, and then the protrusions 82A are formed and the second leads 83B are formed, and then the structure illustrated in FIG. 13A is formed, after that the semiconductor apparatus may also be formed via the processes in FIG. 13B to FIG. 13D. In the above, the order of the forming of the protrusions 82A and the forming of the second leads 83B is interchangeable. Also in this case, the electrode 43 on the bottom side may be formed at any stage of technical feasibility as necessary.

Figure 14A:
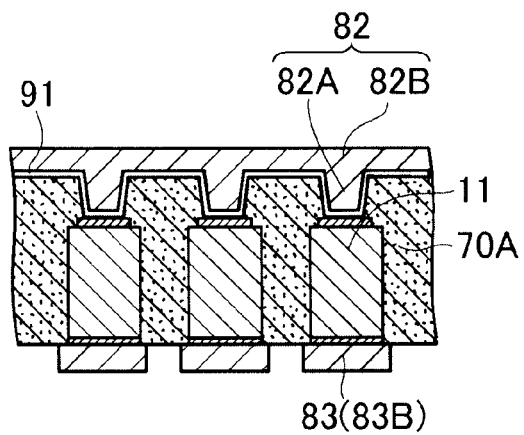
FIGS. 14A and 14B are views of manufacturing processes illustrating another method for manufacturing the semiconductor apparatus according to the third embodiment.
Figure 14B:
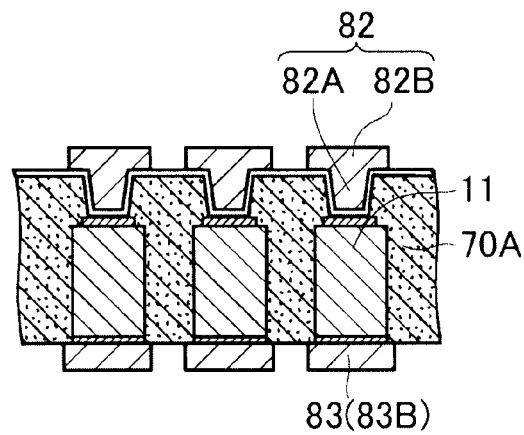

FIGS. 14A and 14B are views of manufacturing processes illustrating another method for manufacturing the semiconductor apparatus according to the third embodiment.

FIGS. 14A and 14B illustrate another example of the processes continuing from FIG. 11A.

As illustrated in FIG. 14A, the second lead 83B is formed on the second face of each of the multiple semiconductor devices 11 (step S362). Subsequently, the protrusions 82A and the first leads 82B are formed by electroplating copper and the like to form the first external electrodes 82 (step S371 and step S372). The order of step S362, step S371, and step S372 may be interchanged.

Then, as illustrated in FIG. 14B, for example, portions of the first leads 82B are separated by, for example, a dicing saw blade. At this time, at least one portion of the sealing member 70 (the first sealing member 70A) may be cut off.

Similar to those described in regard to, for example, FIG. 11D, the semiconductor apparatus are completed by separating the semiconductor devices 11. In this method, the resist 92 is not used, and the processes are simplified.

The semiconductor devices 11 may be separated by cutting off the entire sealing member 70 (the first sealing member 70A) continuing after the portions of the first leads 82B are separated. In such a case, prior to, for example, the separating the portions of the first leads 82B, the first leads 82B and the semiconductor devices 11 are continuously separated after the work is adhered to a dicing sheet 94.

For example, after the process described with reference to FIG. 12C, the bottom face side of the semiconductor wafer 50 is ground to divide the wafer into the semiconductor devices 11, and then the protrusions 82A and the first leads 82B are formed and the second leads 83B are formed, and then the structure illustrated in FIG. 14A may also be formed. In the above, the order of the forming of the protrusions 82A and the first leads 82B and the forming of the second leads 83B is interchangeable. Also in this case, the electrode 43 on the bottom side may be formed at any stage of technical feasibility as necessary.

Figure 15A:
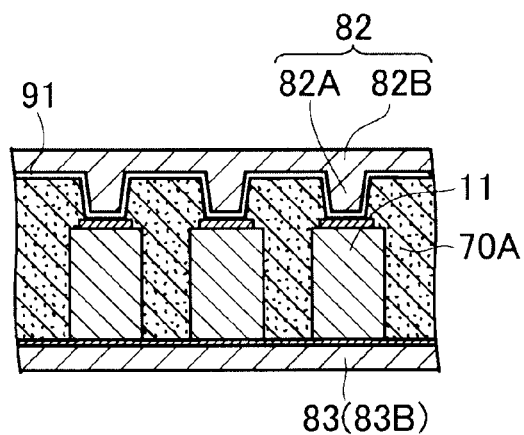
FIGS. 15A and 15B are views of manufacturing processes illustrating another method for manufacturing the semiconductor apparatus according to the third embodiment.
Figure 15B:
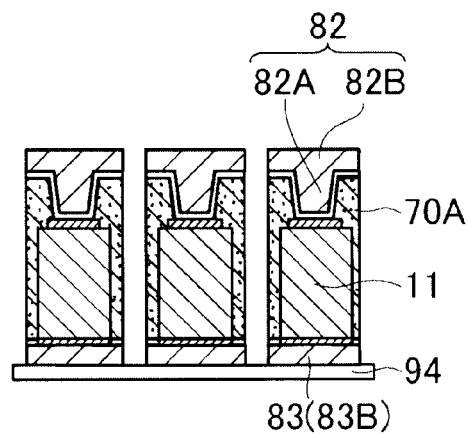

FIGS. 15A and 15B are views of manufacturing processes illustrating another method for manufacturing the semiconductor apparatus according to the third embodiment.

FIGS. 15A and 15B illustrate another example of the processes continuing from FIG. 11A.

As illustrated in FIG. 15A, by electroplating copper and the like, the second lead 83B is formed on the second face of each of the multiple semiconductor devices 11, and at the same time, the protrusions 82A and the first leads 82B are formed to form the first external electrodes 82. In such a method, the first leads 82B are continuously provided on the top face side of each of the multiple semiconductor devices 11, and the second leads 83B are continuously provided on the bottom face side of each of the multiple semiconductor devices 11.

Then, as illustrated in FIG. 15B, the work is adhered to the dicing sheet 94 to collectively separate the first leads 82B, the sealing member 70 (the first sealing member 70A), and the second lead 83B by a dicing saw blade.

This method further simplifies the processes.

For example, after the process described with reference to FIG. 12C, the bottom face side of the semiconductor wafer 50 is ground to divide the wafer into the semiconductor devices 11, and then the protrusions 82A and the first leads 82B are formed and the second leads 83B are formed, and then the structure illustrated in FIG. 15A may also be formed. In the above, the order of the forming of the protrusions 82A and the first leads 82B and the forming of the second leads 83B is interchangeable. Also in this case, the electrode 43 on the bottom side may be formed at any stage of technical feasibility as necessary.

Figure 16A:
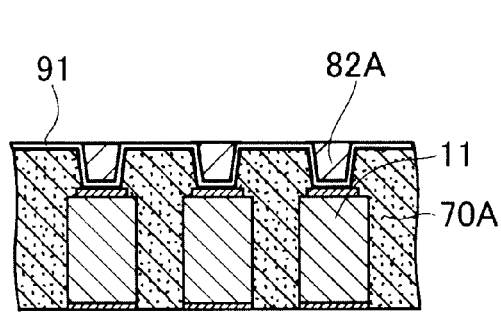
FIGS. 16A to 16C are views of manufacturing processes illustrating another method for manufacturing the semiconductor apparatus according to the third embodiment.
Figure 16B:
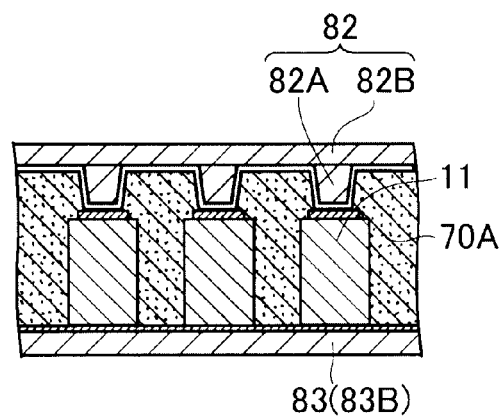
Figure 16C:
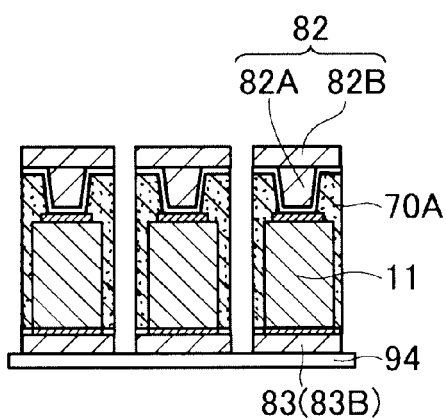

FIGS. 16A to 16C are views of manufacturing processes illustrating another method for manufacturing the semiconductor apparatus according to the third embodiment.

FIGS. 16A to 16C illustrate another example of the processes continuing from FIG. 11A.

As illustrated in FIG. 16A, a conductive material is filled into an interior of the openings (the holes 90) by, for example, electroplating copper and the like, to form the protrusions 82A. A method of coating, for example, a conductive past and the like by various methods such as printing, potting and the like may be used for the forming of the protrusions 82A.

Then, as illustrated in FIG. 16B, by electroplating copper and the like, the second lead 83B is formed on the second face of each of the multiple semiconductor devices 11, and at the same time, the first leads 82B are formed to form the first external electrodes 82. For example, a method of adhering a conductive sheet may be applied to at least one selected from the forming of the second lead 83B and the forming of the first leads 82B.

Continuing as illustrated in FIG. 16C, for example, the work is adhered to the dicing sheet 94 to collectively separate the first leads 82B, the sealing member 70 (the first sealing member 70A), and the second lead 83B by a dicing saw blade.

This method also simplified the processes.

For example, after the process described with reference to FIG. 12C, the bottom face side of the semiconductor wafer 50 is ground to divide the wafer into the semiconductor devices 11, and then the protrusions 82A are formed and the structure illustrated in FIG. 16A may also be formed. Also in this case, the electrode 43 on the bottom side may be formed at any stage of technical feasibility as necessary.

Thus, several variations are possible in the method for manufacturing a semiconductor apparatus according to this embodiment.

In the semiconductor apparatus and the method for manufacturing the same according to this embodiment as well, the protrusion 82A is provided on the first external electrode 82 and a protrusion is not added to the second external electrode 83. Therefore, comparing to the case where protrusions are provided on both the first external electrode 82 and the second external electrode 83, manufacturing processes can be omitted; components (protrusions) can be omitted; and costs can be reduced even more than in the case where protrusions are provided on both the top face and the bottom face.

In the case where, for example, protrusions are provided on both the first external electrode 82 and the second external electrode 83, a process of making the openings in the second sealing member to reach the electrodes on the bottom face side of the semiconductor devices (e.g., step S340) may be implemented between, for example, step S330 and step S350 illustrated in FIG. 9; and a process of filling a conductive material into the openings of the second sealing member to form the second protrusions (e.g., step S361) may be implemented between step S350 and step S362. In comparison, step S340 and step S361 recited above can be omitted in the manufacturing method according to this embodiment; and costs can be reduced even more than in the case where protrusions are provided on both the top face and the bottom face.

Thus, according to this embodiment, processes can be omitted; and a semiconductor apparatus can be manufactured by simpler processes.

According to methods for manufacturing the semiconductor apparatuses according to the second and third embodiments, semiconductor apparatuses having any configuration can be manufactured such as, for example, a semiconductor apparatus having the configuration illustrated in FIG. 1 (in which the cross section of the sealing member 70 is slightly larger than those of the first external electrode 82 and the second external electrode 83) and a semiconductor apparatus having the configuration illustrated in FIG. 5 (in which the side face of the sealing member 70, the side face of the first external electrode 82, and the side face of the second external electrode 83 are in substantially the same plane).

Fourth Embodiment

Figure 17:
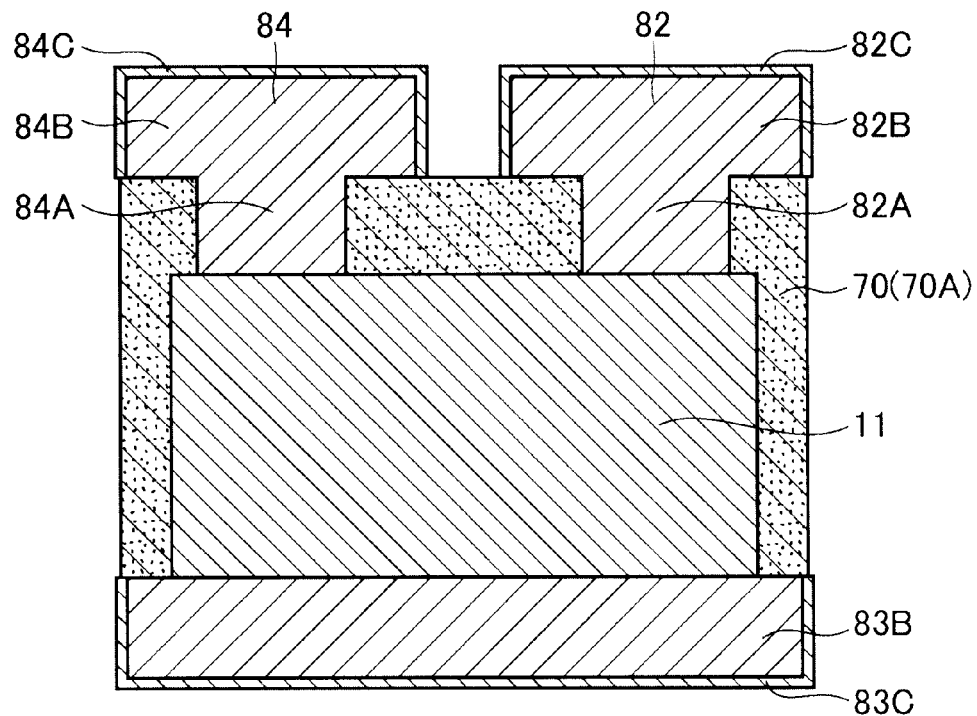
FIG. 17 is a schematic view of another semiconductor apparatus according to a fourth embodiment.

FIG. 17 is a schematic view of another semiconductor apparatus according to a fourth embodiment.

Namely, FIG. 17 is a schematic cross-sectional view corresponding to FIG. 1B.

As illustrated in FIG. 17, in the semiconductor apparatus of this specific example, two external electrodes, i.e., the first external electrode 82 and a third external electrode 84, are provided on the top face of the semiconductor device 11. The third external electrode 84 includes a protrusion 84A protruding in the direction perpendicular to the first major surface substantially parallel to the top face of the semiconductor device 11 to connect to the electrode of the top face of the semiconductor device 11. In FIG. 17, the electrode of the semiconductor device 11 is omitted. The third external electrode 84 includes the protrusion 84A and a third lead 84B. A plating layer 84C is provided on surfaces of the third external electrode 84.

On the other hand, the second external electrode 83 is provided on the bottom face of the semiconductor device 11. In this specific example, the second external electrode 83 does not include a protrusion.

Thus, the semiconductor apparatus according to this embodiment includes: the semiconductor device 11 including the first face (corresponding to the top face) and the second face (corresponding to the bottom face) opposing each other and an electrode (e.g., the electrode 44) provided on the first face; the first external electrode 82 (including the protrusion 82A and the first lead 82B) opposing the first face of the semiconductor device 11, where the first external electrode 82 includes a first major surface substantially parallel to the first face, a first side face substantially perpendicular to the first major surface, and a protrusion (the protrusion 82A) protruding in a direction perpendicular to the first major surface to connect to a first electrode (the electrode 44); the second external electrode 83 (including the second lead 83B) opposing the second face of the semiconductor device 11, where the second external electrode 83 includes a second major surface substantially parallel to the second face and a second side face substantially perpendicular to the second major surface; the third external electrode 84 (including the protrusion 84A and the third lead 84B) opposing the first face of the semiconductor device 11, where the third external electrode 84 includes a third major surface substantially parallel to the first face, a third side face substantially perpendicular to the third major surface, and the protrusion 84A protruding in a direction perpendicular to the third major surface to contact the first face; and an insulator (the sealing member 70) covering the semiconductor device 11, the protrusion 82A of the first external electrode 82, and the protrusion 84A of the third external electrode 84. The first side face, the second side face, and the third side face are mounting faces; and the semiconductor device 11 is disposed between the first external electrode 82 and the second external electrode 83 and between the third external electrode 84 and the second external electrode 83.

The semiconductor device 11 may include an electrode (not illustrated) provided on the first face apart from the electrode (the electrode 44) recited above. In such a case, the protrusion 84A of the third external electrode 84 may connect to the electrode apart from the electrode (the electrode 44) recited above.

In this specific example, the second external electrode 83 does not include a protrusion. That is, the second external electrode 83 further includes an opposite face on the side opposite to the second major surface having substantially the same size as that of the second major surface. In other words, the cross-sectional configuration of the second external electrode 83 when cut in a plane perpendicular to the direction from the second external electrode 83 toward the semiconductor device 11 is substantially constant along the direction from the second external electrode 83 toward the semiconductor device 11.

For example, the semiconductor device 11 may be a transistor; the first external electrode 82 may be, for example, a gate electrode; the second external electrode 83 may be a drain electrode; and the third external electrode 84 may be a source electrode.

According to such a manufacturing method, a semiconductor apparatus can be downsized as an entirety and provided with reduced material and manufacturing costs.

Such a semiconductor apparatus may be manufactured by the manufacturing methods described in regard to FIGS. 2 to 16C and variations thereof. A protrusion is not added to the second external electrode 83. Thereby, comparing to the case where protrusions are provided on both the first external electrode 82 (and the third external electrode 84) and the second external electrode 83, manufacturing processes can be omitted; components (protrusions) can be omitted; and costs can be reduced even more than in the case where protrusions are provided on both the top face and the bottom face.

However, the embodiments of the invention are not limited thereto. The second external electrode 83 also may include a protrusion.

In other words, in the embodiments of the invention, it is sufficient that at least one selected from the first external electrode 82 and the second external electrode 83 provided on the top face and the bottom face, respectively, of the semiconductor device 11 includes a protrusion. Then, it is sufficient to further include the third external electrode 84 provided on at least one selected from the top face and the bottom face of the semiconductor device 11. The third external electrode 84 may or may not include a protrusion. The third external electrode 84 may be singular or multiple.

Figure 18:
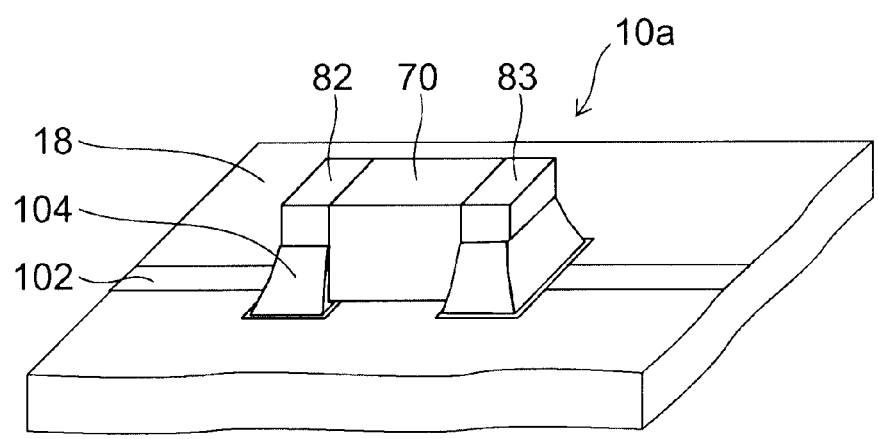
FIG. 18 is a schematic perspective view illustrating a mounting state of the semiconductor apparatus according to an embodiment of the invention.

FIG. 18 is a schematic perspective view illustrating a mounting state of the semiconductor apparatus according to an embodiment of the invention.

As illustrated in FIG. 18, a semiconductor apparatus 10a according to any embodiment of the invention is mounted, for example, on an electrode pad 102 of a substrate 18. At this time, the first side face of the first external electrode 82 and the second side face of the second external electrode 83 are the mounting faces. The semiconductor device 11 is disposed between the first external electrode 82 and the second external electrode 83. The electrode pad 102 is electrically connected to the first external electrode 82 and the second external electrode 83 by, for example, solder 104.

The semiconductor apparatuses according to the embodiments of the invention have excellent mountability because electrodes are formed on the entire side face of the package. Cost reductions are possible because mass production is possible by collectively processing the wafer and because the manufacturing processes do not use frames or substrates. Further, while low clamping voltages are difficult to obtain in conventional wire bonding structures due to long wires, low clamping voltages are possible in the semiconductor apparatuses according to the embodiments. Moreover, the semiconductor apparatuses can be micro-sized, allowing micro-sized electronic devices in which the semiconductor apparatuses are used.

Figure 19:
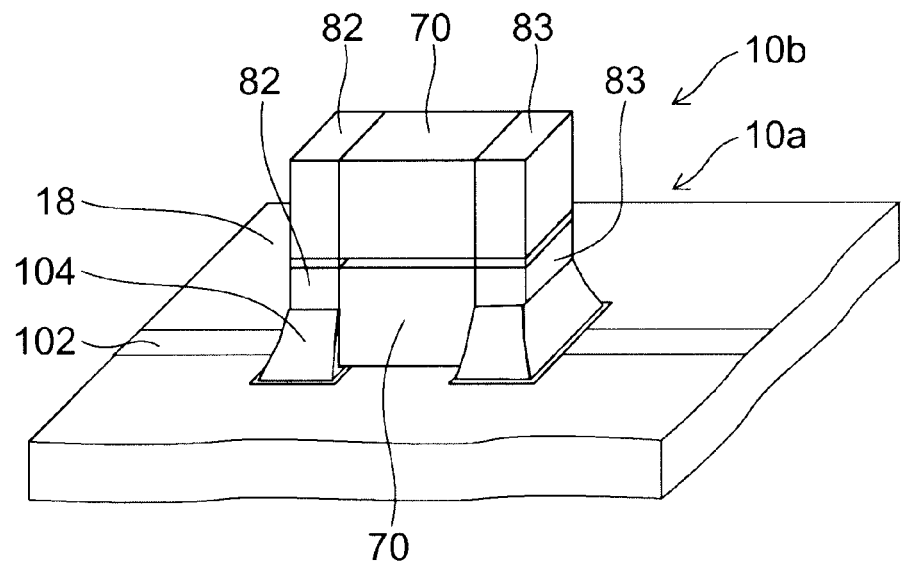
FIG. 19 is a schematic perspective view illustrating a variation of the mounting state of semiconductor apparatuses according to the embodiment of the invention.

FIG. 19 is a schematic perspective view illustrating a variation of the mounting state of semiconductor apparatuses according to the embodiments of the invention.

As illustrated in FIG. 19, the semiconductor apparatus 10a according to any of the embodiments of the invention is mounted, for example, on the electrode pad 102 of the substrate 18; and further, a semiconductor apparatus 10b according to any of the embodiments of the invention is mounted on the semiconductor apparatus 10a. The first external electrode 82 of the semiconductor apparatus 10a on the lower side is connected to, for example, the first external electrode 82 of the semiconductor apparatus 10b on the upper side by, for example, the solder 104; and the second external electrode 83 of the semiconductor apparatus 10a on the lower side is connected to, for example, the second external electrode 83 of the semiconductor apparatus 10b on the upper side by, for example, the solder 104. Thus, according to the semiconductor apparatuses according to the embodiments of the invention, mounting methods for easily stacking semiconductor apparatuses are possible; and further downsizing of the electronic devices in which the semiconductor apparatuses are used is possible.

Figure 20:
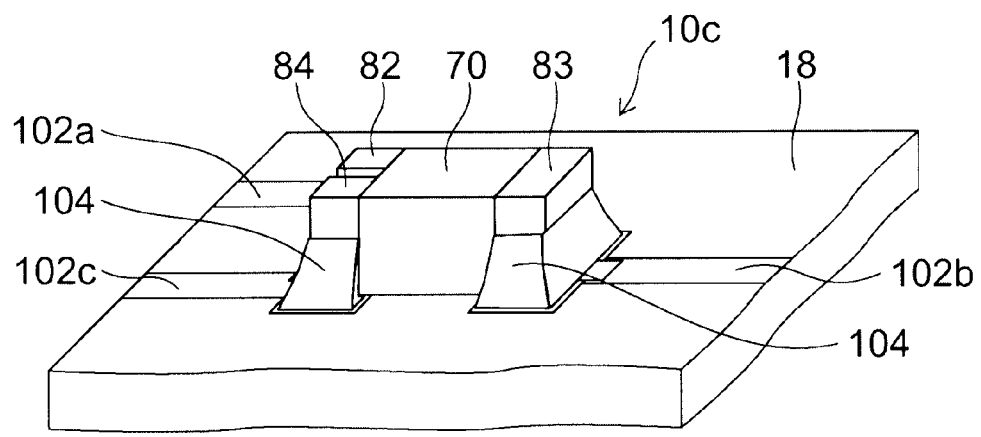
FIG. 20 is a schematic perspective view illustrating the mounting state of another semiconductor apparatus according to the embodiment of the invention.

FIG. 20 is a schematic perspective view illustrating the mounting state of another semiconductor apparatus according to an embodiment of the invention.

As illustrated in FIG. 20, the semiconductor apparatus illustrated in FIG. 17 (a semiconductor apparatus 10c) is mounted, for example, on electrode pads 102a, 102b, and 102c of the substrate 18. The electrode pads 102a, 102b and 102c, for example, are connected to the first external electrode 82, the second external electrode 83, and the third external electrode 84, respectively, by, for example, the solder 104. At this time as well, the first side face of the first external electrode 82 and the second side face of the second external electrode 83 are mounting faces; and the semiconductor device 11 is disposed between the first external electrode 82 and the second external electrode 83.

Hereinabove, exemplary embodiments of the invention are described with reference to specific examples. However, the invention is not limited to these specific examples. For example, one skilled in the art may appropriately select specific configurations of components of semiconductor apparatuses such as semiconductor devices, electrodes, protrusions, leads, plating layers, insulators, sealing members, conductive sheets, and the like from known art and similarly practice the invention. Such practice is included in the scope of the invention to the extent that similar effects thereto are obtained.

Further, any two or more components of the specific examples may be combined within the extent of technical feasibility; and are included in the scope of the invention to the extent that the purport of the invention is included.

Moreover, all semiconductor apparatuses and methods for manufacturing semiconductor apparatuses practicable by an appropriate design modification by one skilled in the art based on the semiconductor apparatuses and the methods for manufacturing semiconductor apparatuses described above as exemplary embodiments of the invention also are within the scope of the invention to the extent that the purport of the invention is included.

Furthermore, various modifications and alterations within the spirit of the invention will be readily apparent to those skilled in the art. All such modifications and alterations should therefore be seen as within the scope of the invention. For example, additions, deletions, or design modifications of components or additions, omissions, or condition modifications of processes appropriately made by one skilled in the art in regard to the embodiments described above are within the scope of the invention to the extent that the purport of the invention is included.

The invention claimed is:

1. A method for manufacturing a semiconductor apparatus, the apparatus including
a semiconductor device including a first face and a second face opposing each other, and an electrode provided on the first face;
a first external electrode opposing the first face of the semiconductor device, the first external electrode including
a first major surface substantially parallel to the first face,
a first side face substantially perpendicular to the first major surface, and
a protrusion protruding in a direction perpendicular to the first major surface to connect to the electrode provided on the first face of the semiconductor device;
a second external electrode opposing the second face of the semiconductor device, the second external electrode including
a second major surface substantially parallel to the second face,
a second side face substantially perpendicular to the second major surface, and
an opposite face on a side opposite to the second major surface, the opposite face being substantially the same size as the second major surface; and
an insulator covering the semiconductor device and the protrusion of the first external electrode,
the first side face and the second side face being mounting faces, the semiconductor device being disposed between the first external electrode and the second external electrode,
the method comprising:
forming the protrusion made of a conductor on each of respective electrodes of the first face provided on a semiconductor wafer top face side of a semiconductor wafer;
making trenches in the top face;
filling an insulator into a gap between the protrusions and into the trenches to form a sealing member;
grinding a bottom face of the semiconductor wafer opposing the top face until the sealing member is exposed to divide the semiconductor wafer into a plurality of semiconductor devices and to form a second face;
forming a first lead made of a conductor on each of the protrusions, the first lead forming a portion of the first external electrode;
forming a conductive material layer directly to form a second lead on the second face of the plurality of semiconductor devices, the second face formed by the grinding, the second lead forming the second external electrode; and
cutting the sealing member between the plurality of semiconductor devices to separate the plurality of semiconductor devices from each other.

2. The method according to claim 1, wherein the forming of the protrusion includes forming the protrusion by plating.

3. The method according to claim 1, wherein at least one of the forming of the first lead includes forming the first lead by plating, and
the forming of the second lead includes forming the second lead by plating.

4. The method according to claim 3, wherein at least of
the cutting the sealing member includes cutting collectively the first lead with the sealing member, the first lead continuing over the plurality of semiconductor devices, and
the cutting the sealing member includes cutting collectively the second lead with the sealing member, the second lead continuing over the plurality of semiconductor devices.

5. The method according to claim 1, wherein at least one of
the forming of the first lead includes adhering a conductive sheet onto the first face of the semiconductor device to form the first lead, and
the forming of the second lead includes adhering a conducting sheet onto the second face of the semiconductor device to form the second lead.

6. The method according to claim 5, wherein the cutting of the sealing member includes collectively cutting the conductive sheet with the sealing member.

7. The method according to claim 1, wherein at least one of the first lead and the second lead is formed of copper.

8. The method according to claim 1, further comprising forming a plating layer on a surface of at least one of the first lead and the second lead.

9. The method according to claim 8, wherein the plating layer includes at least one of a nickel layer, a tin layer, and a stacked film having a nickel layer and a tin layer.

10. The method according to claim 1, wherein the second major surface is substantially a same size as the first major surface.

* * * * *